US010515977B2

(12) United States Patent
Wu et al.

(10) Patent No.: US 10,515,977 B2
(45) Date of Patent: Dec. 24, 2019

(54) BOUNDARY DESIGN TO REDUCE MEMORY ARRAY EDGE CMP DISHING EFFECT

(71) Applicant: Taiwan Semiconductor Manufacturing Co., Ltd., Hsin-Chu (TW)

(72) Inventors: Wei Cheng Wu, Zhubei (TW); Chien-Hung Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/033,357

(22) Filed: Jul. 12, 2018

(65) Prior Publication Data
US 2019/0035801 A1 Jan. 31, 2019

Related U.S. Application Data

(60) Provisional application No. 62/537,131, filed on Jul. 26, 2017.

(51) Int. Cl.
*H01L 27/11575* (2017.01)
*H01L 29/06* (2006.01)

(52) U.S. Cl.
CPC .... *H01L 27/11575* (2013.01); *H01L 29/0649* (2013.01)

(58) Field of Classification Search
CPC ......... H01L 27/11521; H01L 27/11573; H01L 27/11575; H01L 29/0649; H01L 29/0653; H01L 29/792; H01L 29/7816
See application file for complete search history.

(56) References Cited

U.S. PATENT DOCUMENTS

2006/0202275 A1 9/2006 Ichige et al.
2007/0267674 A1 11/2007 Lin et al.
(Continued)

OTHER PUBLICATIONS

Dr. Lynn Fuller. "Chemical Vapor Deposition." Rochester Institute of Technology Microelectronic Engineering. Apr. 24, 2013.

*Primary Examiner* — Cuong Q Nguyen
(74) *Attorney, Agent, or Firm* — Eschweiler & Potashnik, LLC

(57) ABSTRACT

In some embodiments, the present disclosure relates to an integrated chip. The integrated chip includes a logic region having a plurality of transistor devices disposed within a substrate, an embedded memory region having a plurality of memory devices disposed within the substrate, and a boundary region separating the logic region from the embedded memory region. The boundary region includes a first isolation structure having a first upper surface and a second upper surface below the first upper surface. The first and second upper surfaces are coupled by an interior sidewall overlying the first isolation structure. The boundary region further includes a memory wall arranged on the second upper surface and surrounding the embedded memory region, and a logic wall arranged on the first upper surface and surrounding the memory wall. The logic wall has an upper surface that is above the plurality of memory devices and the memory wall.

20 Claims, 14 Drawing Sheets

(56) References Cited

U.S. PATENT DOCUMENTS

| | | | |
|---|---|---|---|
| 2007/0293029 A1* | 12/2007 | Ogawa | H01L 27/11526 438/585 |
| 2012/0139022 A1 | 6/2012 | Lin et al. | |
| 2015/0137206 A1 | 5/2015 | Liu et al. | |
| 2017/0092650 A1 | 3/2017 | Chen et al. | |
| 2017/0110202 A1 | 4/2017 | Wu et al. | |
| 2018/0315765 A1* | 11/2018 | Lin | H01L 27/11521 |

* cited by examiner

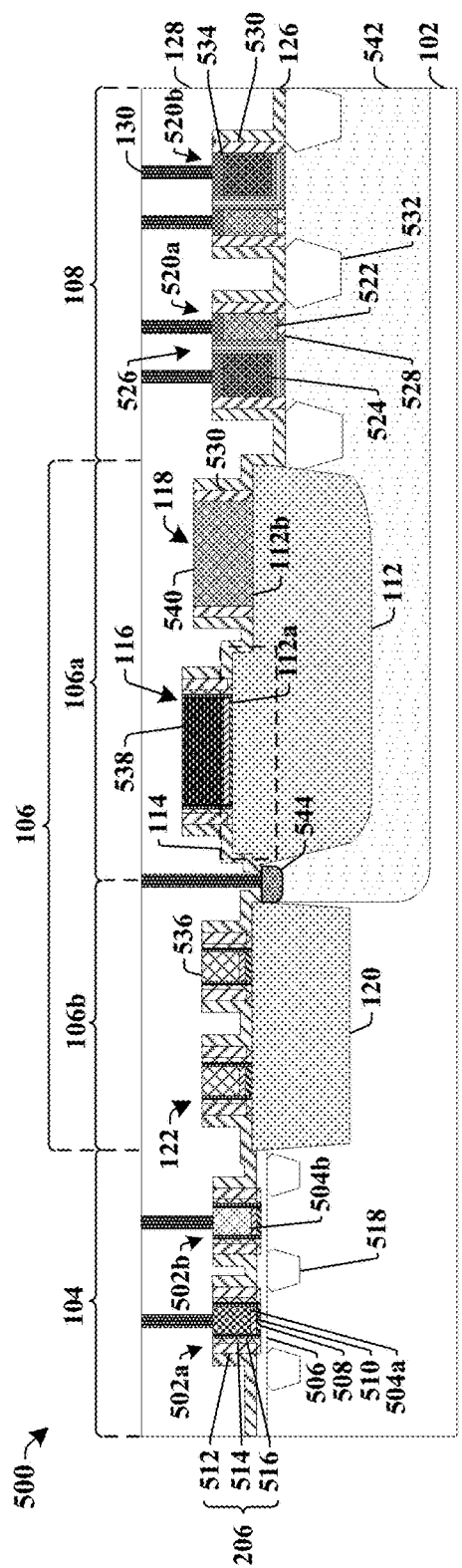
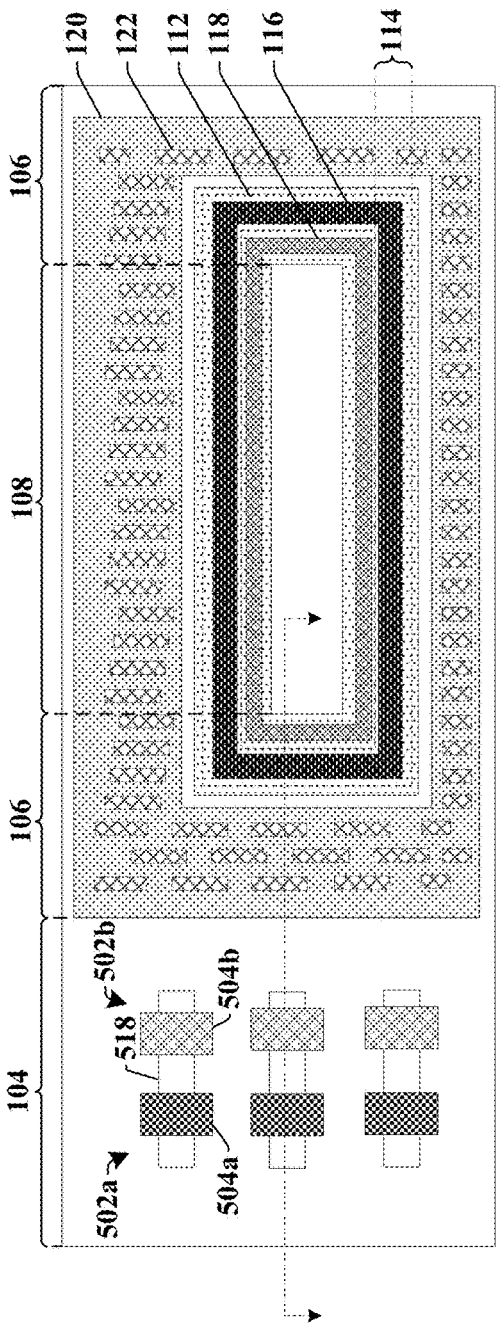
Fig. 5A
Fig. 5B

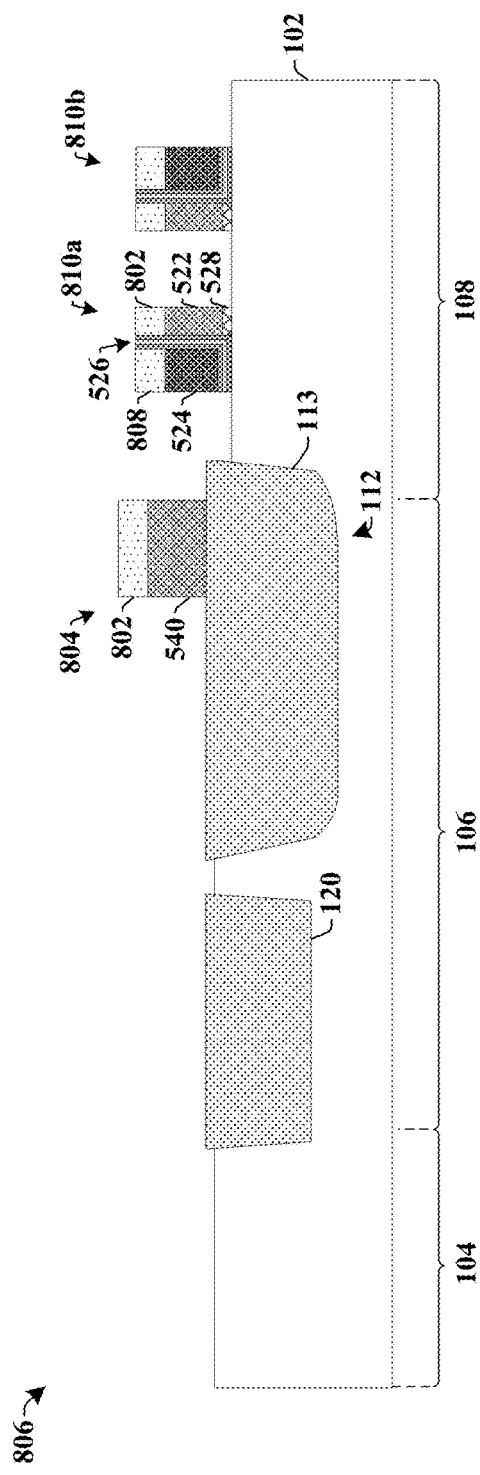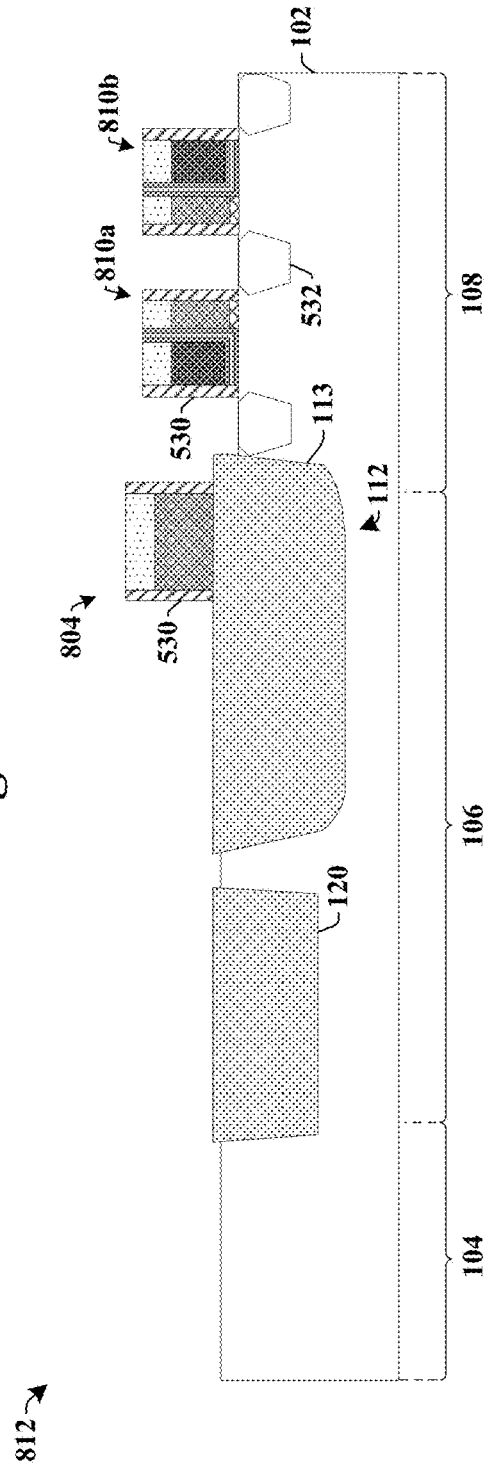

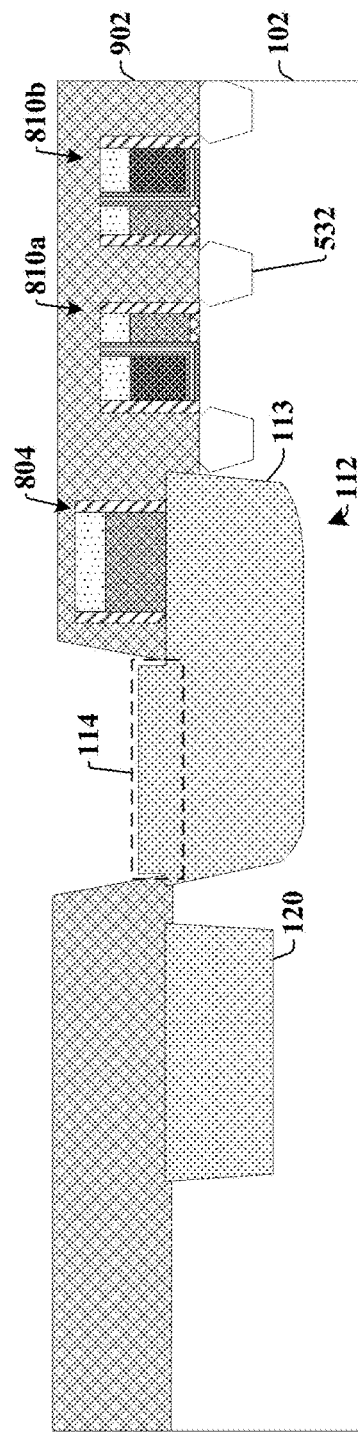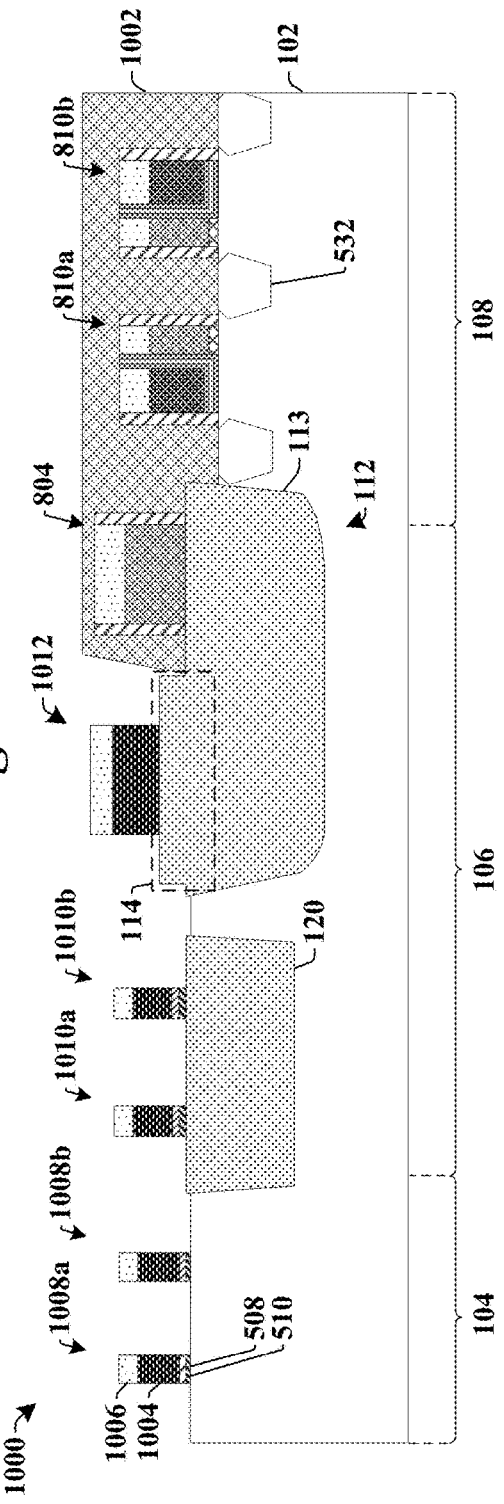

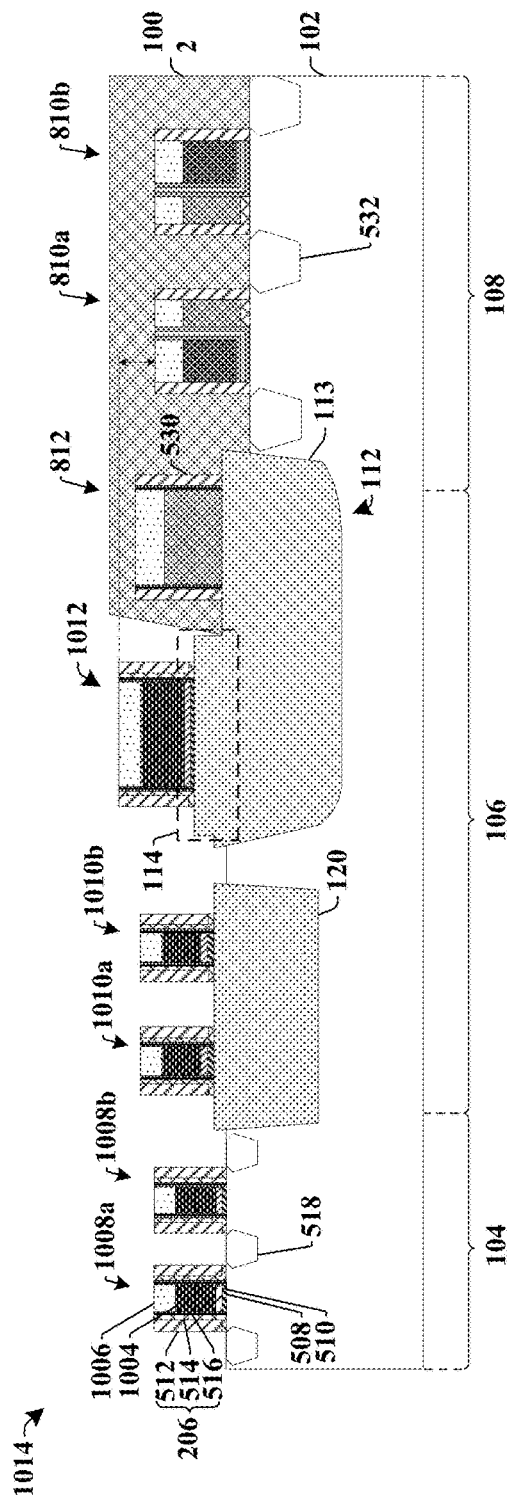
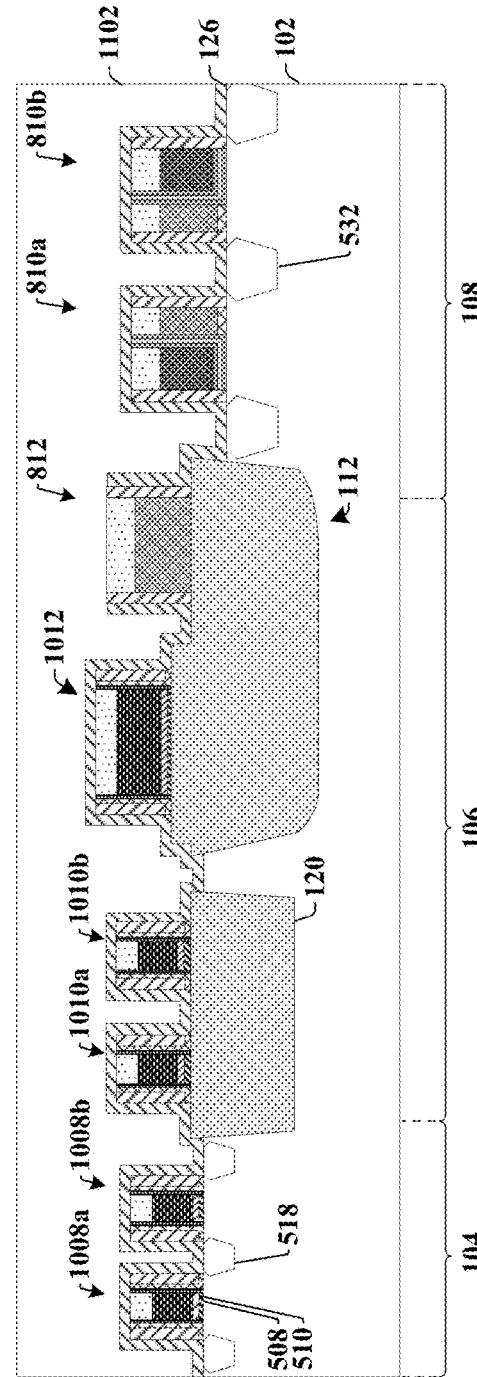
Fig. 10B
Fig. 11

BOUNDARY DESIGN TO REDUCE MEMORY ARRAY EDGE CMP DISHING EFFECT

REFERENCE TO RELATED APPLICATION

This Application claims priority to U.S. Provisional Application No. 62/537,131 filed on Jul. 26, 2017, the contents of which are hereby incorporated by reference in their entirety.

BACKGROUND

Today's electronic devices (e.g., computers, digital cameras, video games, etc.) commonly contain electronic memory that is used to store data (e.g., files, pictures, etc.). Electronic memory comes in a variety of different types. One type of electronic memory that is widely used is flash memory. Flash memory is a non-volatile memory (i.e., a memory that retains data when not powered) that provides for easy and fast data storage. Flash memory stores information by trapping charges on a charge trapping layer in a memory cell. The trapped charges are indicative of a data state stored by the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate some additional embodiments of an integrated chip having an embedded memory region separated from a logic region by a boundary region.

FIGS. 7-15 illustrate cross-sectional views of some embodiments of a method of forming an integrated chip having an embedded memory region separated from a logic region by a boundary region.

DETAILED DESCRIPTION

Figure 1:
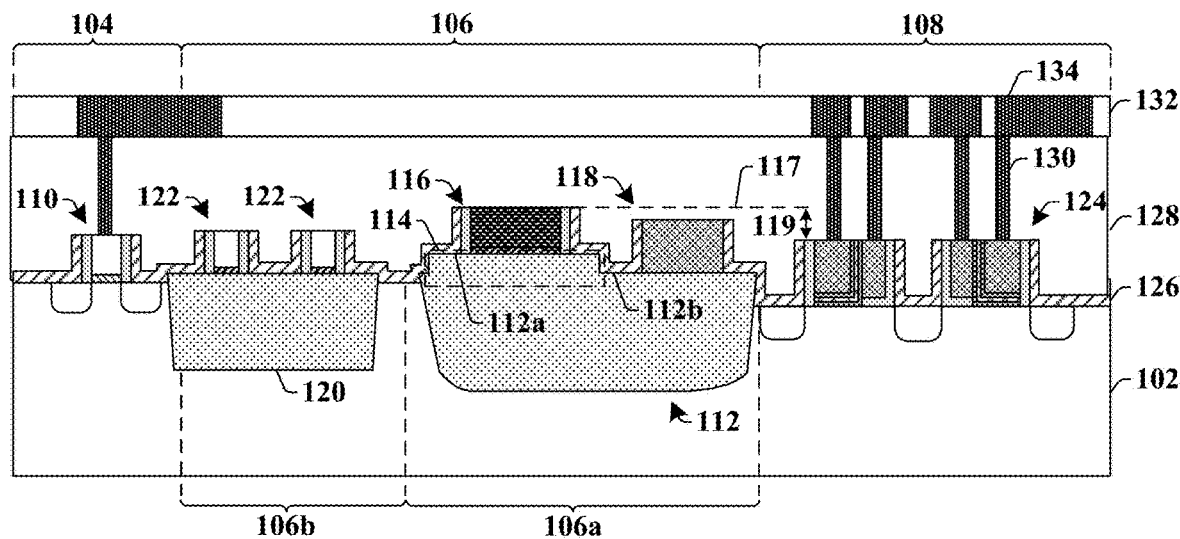
FIG. 1 illustrates a cross-sectional view of some embodiments of an integrated chip having an embedded memory region separated from a logic region by a boundary region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern day integrated chips comprise embedded memory systems, in which logic devices and non-volatile memory (NVM) devices are integrated on a same semiconductor body. The integration of logic and NVM memory devices onto a same semiconductor body offers improved performance and lower cost over systems having separate chips for memory and logic. For example, the integration of logic and NVM devices onto a same semiconductor body reduces undesirable delays through wires or leads that connect two separate chips. Generally, embedded memory systems are fabricated by separately forming NVM devices (e.g., flash memory devices) and logic devices (e.g., transistors) within different regions of a semiconductor body.

Sometimes, to further improve performance, embedded memory systems may use logic devices comprising high-k metal gate transistors formed by a metal gate replacement process. Within a typical metal gate replacement process, dummy gate electrodes are formed over a substrate and a dielectric material is formed over and around the dummy gate electrodes. A first planarization process is then performed to expose tops of the dummy gate electrodes followed by an etching process to remove the dummy gate electrodes. One or more gate metals are subsequently formed in place of the removed dummy gate electrodes and a second planarization process is used to remove excess of the gate metals.

Within an embedded memory system, the planarization processes used in the metal gate replacement process will operate on both the NVM devices and the transistor devices. It has been appreciated that during the planarization processes, softer material surrounding an array of the NVM devices may allow erosion and/or dishing along edges of the array. The erosion and/or dishing can cause control gates along the edges to have smaller heights than control gates in a center of the array. For example, dishing can cause control gates along the edges to have a height that is up to approximately 35% smaller than heights of control gates in the center of the array. When the control gates of the array are subsequently silicided to reduce contact resistance, the lower control gate height may lead to full silicidation of the control gates along the edges, resulting in increased leakage between the control gates and the semiconductor body.

The present disclosure, in some embodiments, relates to an integrated chip having an embedded memory region separated from a logic region by a boundary region that is configured reduce erosion and/or dishing along edges of an embedded memory array, an associated method of fabrication. The integrated chip comprises a logic region having a plurality of transistor devices and an embedded memory region having a plurality of memory devices. A boundary region separates the embedded memory region from the logic region. The boundary region comprises a memory wall surrounding the embedded memory region and a logic wall surrounding the memory wall. The logic wall has an upper surface that is above the memory wall and the plurality of memory devices. Because the logic wall has an upper surface that is above the memory wall and the plurality of memory devices, the logic wall is able to provide for increased resistance to erosion and/or dishing along edges of an array of the memory devices.

FIG. 1 illustrates a cross-sectional view of some embodiments of an integrated chip 100 having an embedded memory region separated from a logic region by a boundary region.

The integrated chip 100 comprises a substrate 102 including a logic region 104 separated from an embedded memory region 108 by a boundary region 106. The logic region 104 comprises a plurality of transistor devices 110 arranged within the substrate 102 and the embedded memory region 108 comprises a plurality of memory devices 124 disposed within the substrate 102. In some embodiments, the plurality of transistor devices 110 may comprise high-k metal gate (HKMG) MOSFET transistors. In some embodiments, the plurality of memory devices 124 may comprise non-volatile memory (NVM) devices (e.g., flash memory devices). A contact etch-stop layer (CESL) 126 is over the substrate 102 and an inter-level dielectric (ILD) layer 128 is over the CESL 126. Conductive contacts 130 are arranged within the ILD layer 128 and one or more metal interconnect layers 134 are arranged within an inter-metal dielectric (IMD) layer 132 over the ILD layer 128.

The boundary region 106 comprises a wall region 106a and a dummy region 106b. The wall region 106a and the dummy region 106b include electrically inactive structures configured to mitigate non-uniformities in planarization removal rates (e.g., erosion and/or dishing caused by a chemical mechanical planarization process) within the logic region 104 and/or within the embedded memory region 108 during manufacture of the integrated chip 100. The wall region 106a is disposed between the dummy region 106b and the embedded memory region 108. The wall region 106a comprises a logic wall 116 and a memory wall 118. In some embodiments, the logic wall 116 and the memory wall 118 may be arranged over a first isolation structure 112 comprising a dielectric material (e.g., an oxide) disposed within the substrate 102. The dummy region 106b is arranged between the wall region 106a and the logic region 104 and comprises a plurality of dummy gate stacks 122 (i.e., a plurality of electrically inactive gate stacks). In some embodiments, the plurality of dummy gate stacks 122 may be arranged over a second isolation structure 120 separated from the first isolation structure 112 by the substrate 102.

The logic wall 116 and the memory wall 118 have sidewalls laterally separated from the ILD layer 128 by the CESL 126. The logic wall 116 and the memory wall 118 also have upper surfaces, facing away from the substrate 102, which are completely covered by the ILD layer 128. In some embodiments, a lower surface of the ILD layer 128 contacting the logic wall 116 may also contact the CESL 126.

The logic wall 116 is arranged over a first upper surface 112a of the first isolation structure 112 and the memory wall 118 is arranged over a second upper surface 112b of the first isolation structure 112. The first upper surface 112a is disposed along a protrusion 114 extending out from the second upper surface 112b. The logic wall 116 has an upper surface arranged along a horizontal plane 117 that overlies upper surfaces of plurality of memory devices 124 by a non-zero distance 119.

Because the logic wall 116 has an upper surface that is higher than upper surfaces of the plurality of memory devices 124, the logic wall 116 is able to provide for structure that is able to mitigate erosion and/or dishing (e.g., due to replacement metal gate planarization processes) on the plurality of memory devices 124 along outer edges of the embedded memory region 108. By mitigating erosion and/or dishing on the plurality of memory devices 124 along the outer edge of the embedded memory region 108, performance of the memory devices 124 within the embedded memory region 108 is improved. Furthermore, a process window of the planarization processes is also improved, thereby reducing processing costs associated with the planarization processes.

In some embodiments, the non-zero distance 119 may be in a range of between approximately 25 angstroms and approximately 100 angstroms. Having the non-zero distance 119 be larger than 25 angstroms provides for improved resistance to dishing from planarization (e.g., CMP) processes, while having the non-zero distance below 100 angstroms retains good planarization of the embedded memory region 106a. In some embodiments, the horizontal plane 117 may also overlie the memory wall 118, the dummy gate stacks 122, and the transistor devices 110. Having the horizontal plane 117 also overlie the memory wall 118 and the plurality of dummy gate stacks 122 prevents and/or reduces under-polishing along peripheries of the embedded memory region 106a and the logic region 106b due to the logic wall 116.

FIGS. 2A-2D illustrate cross-sectional views of some embodiments of a boundary region (e.g., 106 of FIG. 1) arranged between an embedded memory region (e.g., 108 of FIG. 1) and a logic region (e.g., 104 of FIG. 1). The embodiments shown in the cross-sectional views of FIGS. 2A-2D illustrate some exemplary embodiments of various combinations of materials that may be used in a logic wall (e.g., 116 of FIG. 1) and in a plurality of dummy gate stacks (e.g., 122 of FIG. 1). It will be appreciated that the combinations of materials are not limited to those shown in FIGS. 2A-2D.

Figure 2A:
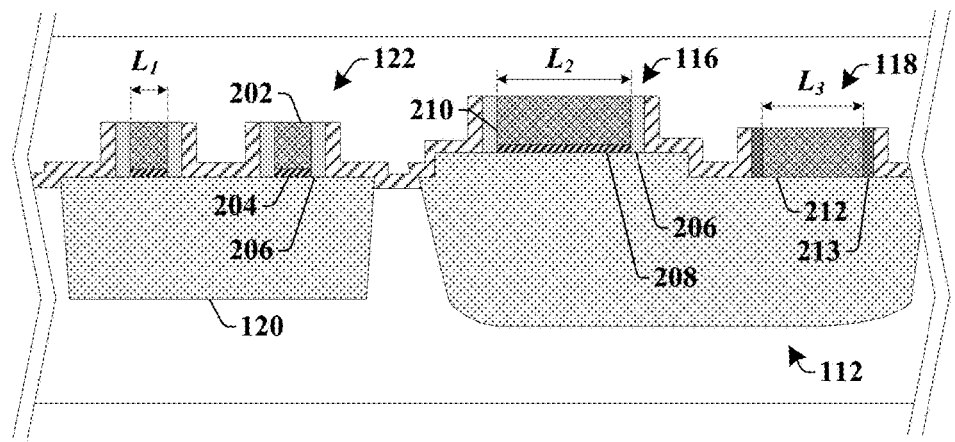
FIGS. 2A-2D illustrate some embodiments of cross-sectional views of a boundary region arranged between an embedded memory region and a logic region.

As shown in cross-sectional view 200 of FIG. 2A, the boundary region comprises a first isolation structure 112 and a second isolation structure 120 laterally separated from the first isolation structure 112 by a non-zero distance. A logic wall 116 and a memory wall 118 are arranged over the first isolation structure 112. A plurality of dummy gate stacks 122 are arranged over the second isolation structure 120.

The logic wall 116 comprises a logic wall core 210 separated from the first isolation structure 112 by a dielectric structure 208 comprising one or more dielectric materials. The memory wall 118 comprises a memory wall core 212 arranged over the first isolation structure 112. In some embodiments, the memory wall core 212 may directly contact the first isolation structure 112. The plurality of dummy gate stacks 122 respectively comprise a dummy gate 202 separated from the second isolation structure 120 by a gate dielectric structure 204 comprising one or more dielectric materials. In some embodiments, the gate dielectric structure 204 and the dielectric structure 208 may comprise stacks of the same dielectric materials.

In some embodiments, the plurality of dummy gates 202 and the logic wall core 210 may be surrounded by sidewall spacers 206 comprising one or more dielectric materials. In some embodiments, the sidewall spacers 206 may comprise a nitride (e.g., silicon nitride), an oxide (e.g., silicon oxide), or the like. In some embodiments, the memory wall core 212 may also be surrounded by sidewall spacers 213 comprising one or more dielectric materials. In some embodiments, sidewall spacers 213 may comprise the same dielectric materials as sidewall spacers 206. In other embodiments, sidewall spacers 213 may comprise different dielectric materials than sidewall spacers 206. In some embodiments, the plurality of dummy gates 202 respectively have a first length $L_1$ between the sidewall spacers 206 and the logic wall core 210 has a second length $L_2$, larger than the first length $L_1$, between the sidewall spacers 206. In some embodiments, the memory wall core 212 may have a third length $L_3$ between the sidewall spacers 213 that is larger than the first length $L_1$. In some embodiments, the third length $L_3$ may be between the first length $L_1$ and the second length $L_2$.

In some embodiments, the memory wall core 212 may comprise polysilicon. In various embodiments, the dummy gates 202 and the logic wall core 210 may comprise various combinations of one or more conductive materials. For example, in some embodiments shown in cross-sectional view 200 of FIG. 2A, the dummy gates 202 and the logic wall core 210 may comprise polysilicon. In such embodiments, the gate dielectric structure 204 and the dielectric structure 208 may comprise a same material (e.g., an oxide). It has been appreciated that a planarization process used to remove gate metals during a replacement metal gate process may remove polysilicon at a slower rate than the gate metals (e.g., a chemical mechanical planarization process may remove 50 angstroms of gate metal during removal of 10 angstroms of polysilicon). Therefore, the use of polysilicon within the logic wall core 210 can further reduce dishing of the memory devices within an embedded memory region (e.g., 108 of FIG. 1).

Figure 2B:
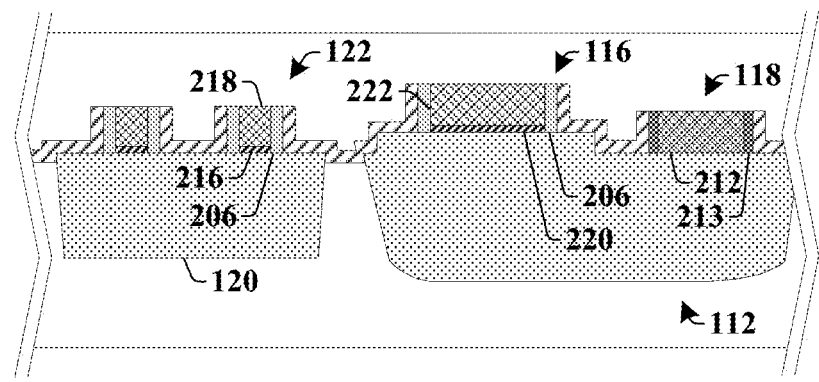

In other embodiments, shown in cross-sectional view 214 of FIG. 2B, the boundary region may comprise dummy gates 218 and a logic wall core 222 comprising one or more gate metals. In such embodiments, the dummy gates 218 may be separated from the substrate 102 by a gate dielectric structure 216 comprising a same material (e.g., a high-k dielectric material) as a dielectric structure 220 separating the logic wall core 222 from the substrate 102. In some embodiments, the one or more gate metals may comprise aluminum, platinum, palladium, nickel, titanium, or a similar metal.

Figure 2C:
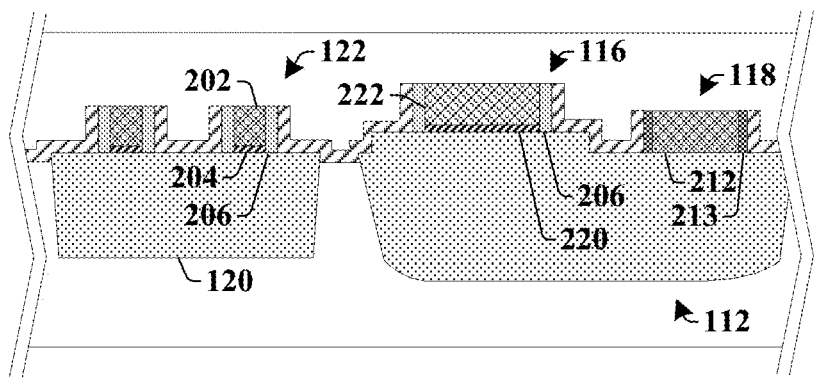

In yet other embodiments, shown in cross-sectional view 224 of FIG. 2C, the boundary region may have dummy gates 202 comprising polysilicon and a logic wall core 222 comprising one or more gate metals. In such embodiments, the dummy gates 202 may be separated from the substrate 102 by a gate dielectric structure 204 comprising a different material than a dielectric structure 220 separating the logic wall core 222 from the substrate 102. For example, the gate dielectric structure 204 may comprise an oxide and/or a nitride and the dielectric structure 220 may comprise a high-k dielectric material (e.g., hafnium oxide).

Figure 2D:
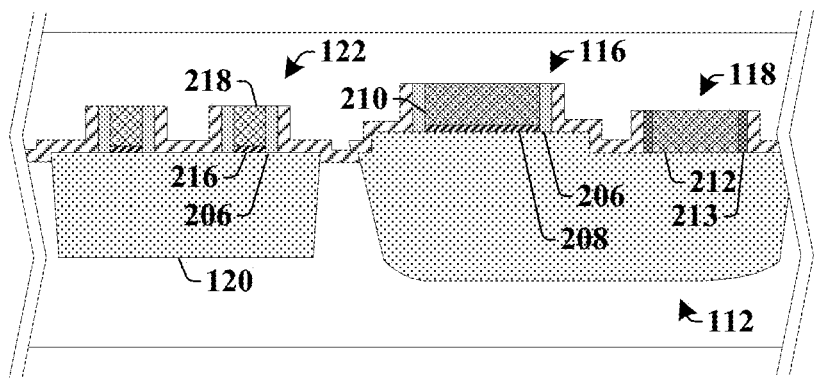

In yet other embodiments, shown in cross-sectional view 226 of FIG. 2D, the boundary region may have dummy gates 218 comprising one or more gate metals and a logic wall core 210 comprising polysilicon. In such embodiments, the dummy gates 218 may be separated from the substrate 102 by a gate dielectric structure 216 comprising a different material than a dielectric structure 208 separating the logic wall core 210 from the substrate 102. For example, the gate dielectric structure 216 may comprise a high-k dielectric material (e.g., hafnium oxide) and the dielectric structure 208 may comprise an oxide and/or a nitride.

Figure 3:
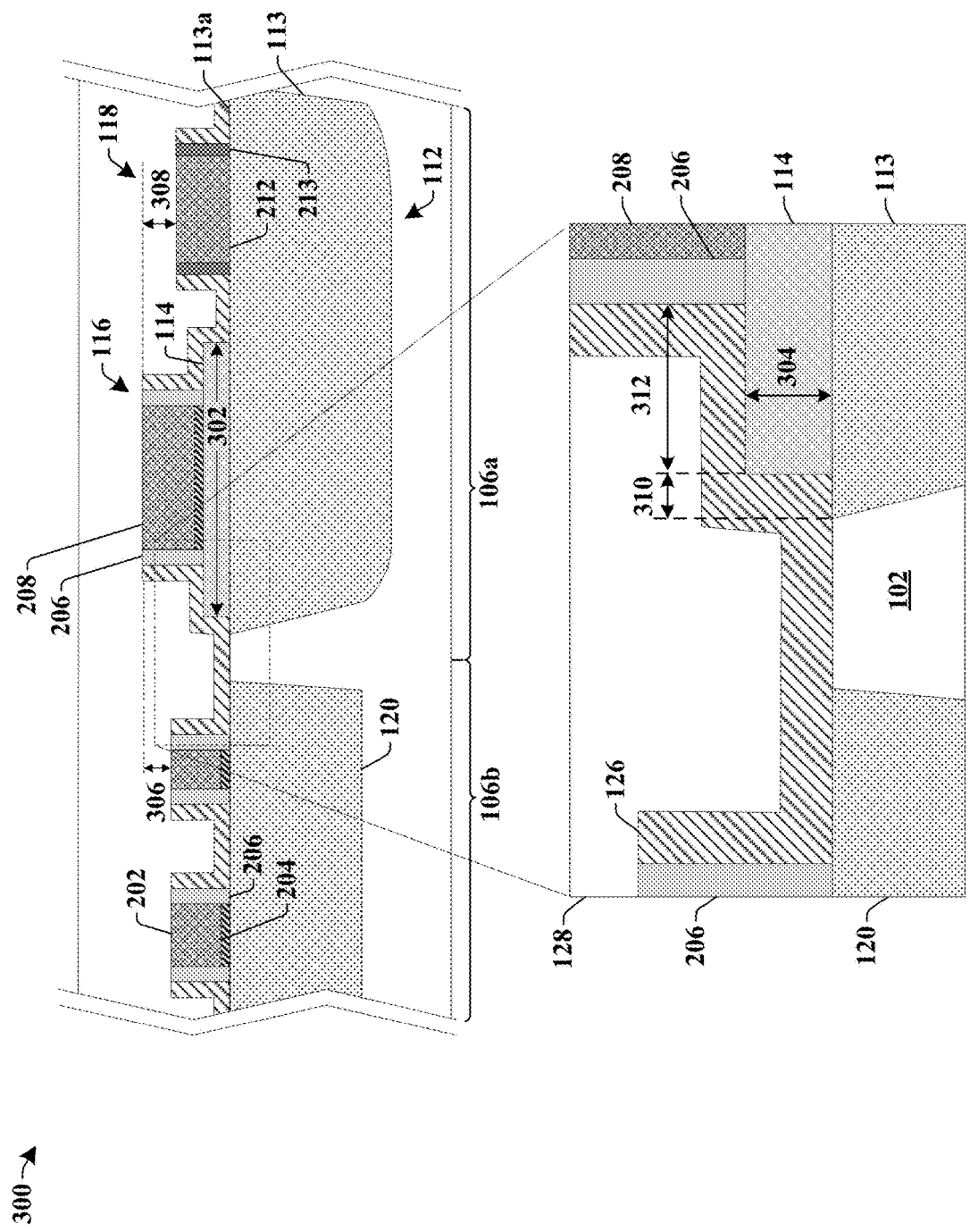
FIG. 3 illustrates some additional embodiments of a cross-sectional view of a boundary region arranged between an embedded memory region and a logic region.

FIG. 3 illustrates a cross-sectional view 300 of some additional embodiments of a disclosed boundary region (e.g., 106 of FIG. 1) arranged between an embedded memory region (e.g., 108 of FIG. 1) and a logic region (e.g., 104 of FIG. 1).

As shown in cross-sectional view 300, the boundary region comprises a wall region 106a and a dummy region 106b. The wall region 106a comprises a first isolation structure 112 having a base region 113 surrounding by a substrate 102 and an overlying protrusion 114. The protrusion 114 directly contacts an upper surface 113a of the base region 113 and has an upper surface that is above the upper surface 113a of the base region 113. In some embodiments, the protrusion 114 is completely confined directly above the base region 113. A logic wall 116 is arranged over the protrusion 114 and a memory wall 118 is arranged on the upper surface 113a of the base region 113 at a position laterally adjacent to the protrusion 114.

In some embodiments, the base region 113 may comprise a first material and the protrusion 114 may comprise a second material that is different than the first material and/or that has different properties than the first material. For example, in some embodiments the first material may comprise silicon dioxide and the second material may comprise silicon nitride, silicon carbide, or the like. In some embodiments, the base region 113 may comprise a low-temperature oxide (LTO) and the protrusion 114 may comprise a high temperature oxide (HTO) (e.g., an oxide that is formed using a LPCVD process at a temperature of greater than or equal to approximately 600° C.). The HTO of the protrusion 114 has a higher density and a higher dielectric strength than the LTO of the base region 113. In other embodiments, the base region 113 may comprise a dielectric material (e.g., silicon dioxide) and the protrusion 114 may comprise a semiconductor (e.g., silicon, polysilicon, germanium, or the like) or a metal (e.g., aluminum, tungsten, titanium, or the like). In yet other embodiments, the base region 113 and the protrusion 114 may comprise a same material (e.g., silicon dioxide).

The protrusion 114 has a width 302 and a height 304. In some embodiments, a ratio of the width 302 to the height 304 may be in a range of between approximately 20 and approximately 250. For example, in some embodiments, the width 302 may be in a range of between approximately 300 microns and approximately 3,750 microns, and the height 304 may be in a range of between approximately 150 angstroms and approximately 500 angstroms.

The height 304 of the protrusion allows the logic wall 116 to have a height that provides for additional support against CMP dishing within an embedded memory region (e.g., 108 of FIG. 1), as described above. If the height 304 of the protrusion 114 is less than approximately 150 angstroms, the logic wall 116 will fail to provide sufficient support against CMP dishing to avoid damage to the embedded memory region (e.g., 108 of FIG. 1). Alternatively, if the height 304 of the protrusion 114 is greater than approximately 400 angstroms, the logic wall 116 will protrude to a height that negatively effects a planarization of a CMP process on the embedded memory region (e.g., resulting in a NVM gate height that is larger around edges of an NVM array than at a center of the NVM array). Furthermore, if the width 302 of the protrusion 114 is less than approximately 300 microns the logic wall 116 will fail to provide sufficient support against CMP dishing to avoid damage to the embedded memory region (e.g., 108 of FIG. 1), while if the width 302 of the protrusion 114 is greater than approximately 3,750 microns the protrusion 113 will unnecessarily consume costly space on an integrated chip.

The height 304 of the protrusion 114 causes an uppermost surface of the logic wall 116 to extend above uppermost surfaces of a plurality of dummy gates 202 by a first distance 306 and above an uppermost surface of the memory wall 118 by a second distance 308. In some embodiments, the first distance 306 may be smaller than the second distance 308. In some embodiments, the first distance 306 may be in a range of between approximately 100 angstroms and approximately 300 angstroms and the second distance 308 may be in a range of between approximately 100 angstroms and approximately 400 angstroms. In other embodiments, the first distance 306 may be in a range of between approximately 150 angstroms and approximately 250 angstroms and the second distance 308 may be in a range of between approximately 200 angstroms and approximately 300 angstroms. In some embodiments, logic wall 116 and the memory wall 118 may have heights that are approximately the same (e.g., between approximately 600 angstroms and approximately 700 angstroms), such that the second distance 308 may be approximately equal to the height 304. Having the second distance 308 in the range of between approximately 100 angstroms and approximately 400 angstroms provides for support against CMP dishing without resulting in a NVM gate height that is larger around edges of an NVM array than in a center of the NVM array.

In some embodiments, the protrusion 114 has an outermost sidewall that may be laterally offset from an outermost sidewall of the base region 113 by a first distance 310. In some embodiments, the first distance 310 may be in a range of between approximately 0 nm and approximately 150 nm. In other embodiments, the first distance 310 may be in a range of between approximately 50 nm and approximately 100 nm. In some embodiments, an outermost sidewall of the logic wall 116 may laterally offset from the outermost sidewall of the protrusion 114 by a second distance 312. In various embodiments, the second distance 312 may be in a range of between approximately 100 nm and approximately 200 nm. The first distance 310 and/or the second distance 312 account for misalignment errors and keep the protrusion 114 and/or the logic wall 116 directly over the base region 113, thereby enabling the formation of conductive contacts at locations neighboring the first isolation structure 112 (e.g., to enable conductive contact 130 to reach contact region 544, as shown in FIG. 5A).

Figure 4:
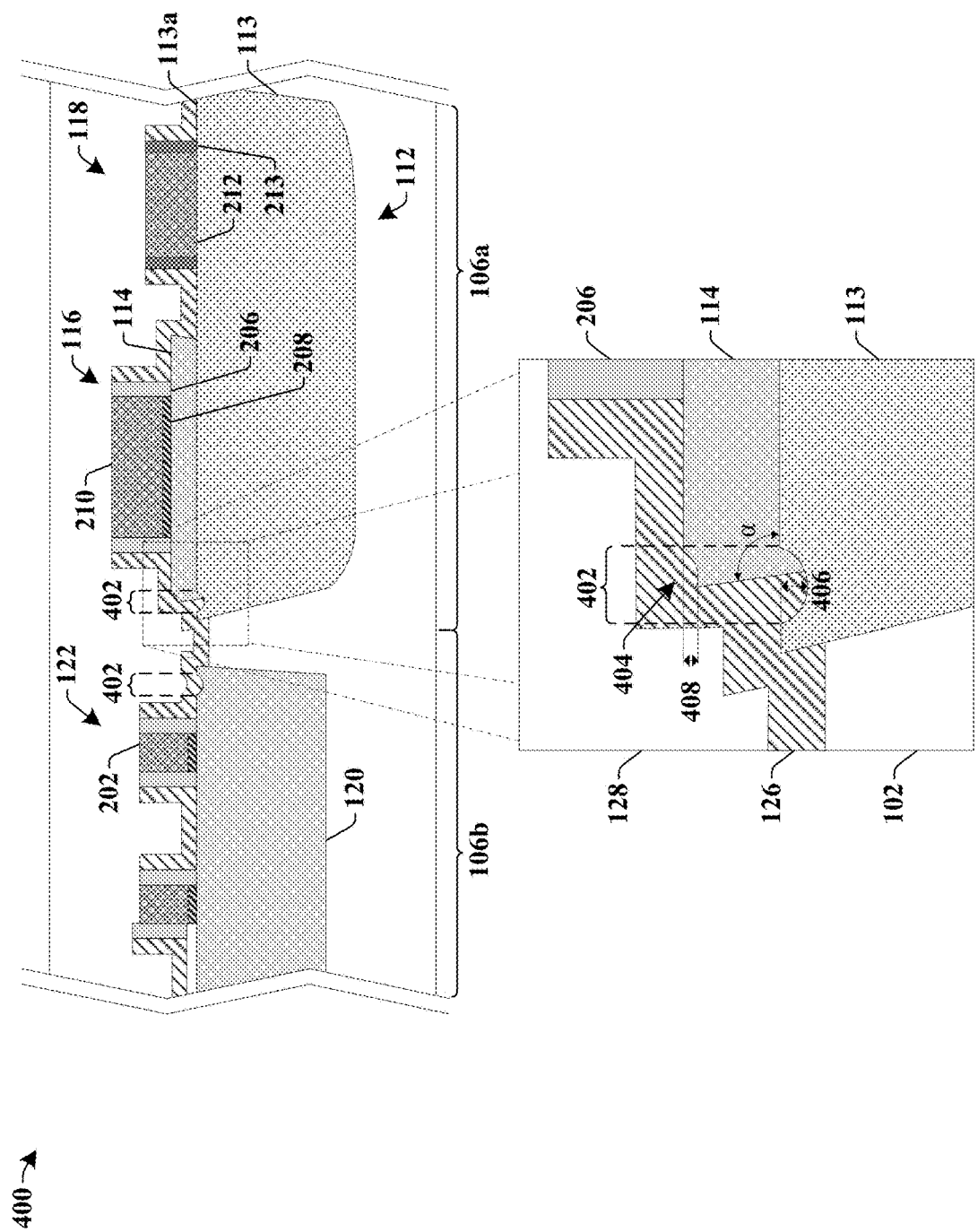
FIG. 4 illustrates some additional embodiments of a cross-sectional view of a boundary region arranged between an embedded memory region and a logic region.

FIG. 4 illustrates a cross-sectional view 400 of some additional embodiments of a disclosed boundary region (e.g., 106 of FIG. 1) arranged between an embedded memory region (e.g., 108 of FIG. 1) and a logic region (e.g., 104 of FIG. 1).

As shown in cross-sectional view 400, the boundary region 106 comprises a wall region 106a and a dummy region 106b. The wall region 106a comprises a first isolation structure 112 having a base region 113 surrounding by a substrate 102 and an overlying protrusion 114 disposed on the base region 113. In some embodiments, sidewalls of the protrusion 114 may be angled at an angle that is between 0° and 90° as measured with respect to a line that is normal to the upper surface 113a of the base region 113. In other embodiments, the sidewalls of the protrusion 114 may be angled at an angle that is between 5° and 85° as measured with respect to the line that is normal to the upper surface 113a of the base region 113.

In some embodiments, the base region 113 may have one or more surfaces defining a first divot 402 recessed below the upper 113a surface of the base region 113. The first divot 402 may be arranged along an edge of the base region 113. In some embodiments, the protrusion 114 comprises one or more dielectric materials that extend to within the first divot 402. In some embodiments, the protrusion 114 may have one or more surfaces defining a second divot 404 that is arranged along an upper surface of the protrusion 114. In some embodiments, the second divot 404 may be arranged directly over the first divot 302. In other embodiments, the second divot 404 may be arranged laterally between the first divot 402 and the logic wall 116. In yet other embodiments, the second divot 404 may be arranged between a first upper surface of the protrusion 114 and a second upper surface of the protrusion 114 that is higher than the first upper surface. In some embodiments, the first divot may have a first depth 406 that is greater than a second depth 408 of the second divot 404.

FIGS. 5A-5B illustrate some additional embodiments of an integrated chip having an embedded memory region separated from a logic region by a boundary region.

As shown in cross-sectional view 500 of FIG. 5A, the integrated chip comprises a substrate 102 having a logic region 104, an embedded memory region 108, and a boundary region 106 separating the logic region 104 from the embedded memory region 108. In various embodiments, the substrate 102 may comprise a semiconductor material such as silicon, germanium, or the like. In some embodiments, the substrate 102 may comprise an SOI (silicon-on-insulator) substrate.

The logic region 104 comprises a plurality of transistor devices. In some embodiments, the transistors devices may be high-k metal gate (HKMG) transistors, 502a and 502b. The HKMG transistors, 502a and 502b, respectively comprise metal gate electrodes, 504a and 504b, separated from the substrate 102 by one or more dielectric layers 506-510. Source/drain regions 518 are arranged on opposing sides of the metal gate electrodes, 504a and 504b. Sidewall spacers 206 extend along outer sidewalls of the metal gate electrodes, 504a and 504b. In some embodiments, the sidewall spacer 206 may comprise a plurality of spacer layers 512-516 comprising different dielectric materials. For example, the sidewall spacers 206 may comprise a first spacer layer 512 comprising a first oxide, a second spacer layer 514 comprising a nitride, and a third spacer layer 516 comprising a second oxide.

In some embodiments, metal gate electrode 504a may comprise a p-type metal (e.g., ruthenium, palladium, or the like) and metal gate electrode 504b may comprise an n-type metal (e.g., hafnium, zirconium, titanium, or the like). In some embodiments, the one or more dielectric layers 506-510 comprise a high-k dielectric layer 508 over a base dielectric layer 506 (e.g., an oxide). In some additional embodiments, the one or more dielectric layers 506-510 may further comprise an etch-stop layer 510 over the high-k dielectric layer 508. In some embodiments, the source/drain regions 518 may comprise highly doped regions of the substrate 102. In other embodiments, the source/drain regions 518 may comprise epitaxial source/drain regions comprising a semiconductor material disposed within recesses within the substrate 102 (e.g., silicon germanium disposed within recesses within a silicon substrate).

The embedded memory region 108 comprises a plurality of split-gate flash memory cells, 520a and 520b. The split-gate flash memory cells, 520a and 520b, respectively comprise a select gate 522 and a control gate 524 separated by a charge trapping layer 526. In some embodiments, the select gate 522 may be separated from the substrate 102 by a gate dielectric 528 (e.g., an oxide, a nitride, or the like). Source/drain regions 532 are arranged along opposing sides of the split-gate flash memory cells, 520a and 520b. In some embodiments, a silicide layer 534 is disposed on upper surfaces of the select gate 522 and the control gate 524.

In some embodiments, the select gate 522 and the control gate 524 may comprise polysilicon. In some embodiments, the charge trapping layer 526 includes a charge trapping nitride layer sandwiched between two oxide layers. In other embodiments, the charge trapping layer 526 may include a layer of silicon nanoparticle dots. In some embodiments, sidewall spacers 530 are disposed along outer sidewalls of the select gate 522 and the control gate 524. In some embodiments, sidewall spacers 530 may be the same (e.g., comprise a same stack of dielectric materials in a same order) as sidewall spacers 206.

Conductive contacts 130 are surrounded by an ILD layer 128 and extend from the silicide layer 534 to overlying metal interconnect layers (not shown). The silicide layer 534 is configured to reduce contact resistance of the conductive contacts 130. In some embodiments, the ILD layer 128 may comprise an oxide, a low-k dielectric material, or an ultra low-k dielectric material. For example, in some embodiments, the ILD layer 128 may comprise borophosphosilicate glass (BPSG), borosilicate glass (BSG), and phosphosilicate glass (PSG), or the like. In some embodiments, a contact etch-stop layer (CESL) 126 is between the substrate 102 and the ILD layer 128.

The boundary region 106 comprises a wall region 106a and a dummy region 106b. The dummy region 106b is arranged between the wall region 106a and the logic region 104 and comprises a plurality of dummy gate stacks 122 (i.e., a plurality of electrically inactive gate stacks). In various embodiments, the plurality of dummy gate stacks 122 may comprise a dummy gate electrode 536 including polysilicon or one or more gate metals. The wall region 106a comprises a logic wall 116 and a memory wall 118. In various embodiments, the logic wall 116 may comprise a logic wall core 538 including polysilicon or one or more gate metals. In some embodiments, the memory wall 118 may comprise a memory wall core 540 including polysilicon or one or more gate metals. In some embodiments, the memory wall core 540 may be a same material (e.g., polysilicon) as the select gate 522 and/or the control gate 524.

In some embodiments, the logic wall 116 and a memory wall 118 may be arranged over a first isolation structure 112 comprising a dielectric material (e.g., an oxide) disposed within the substrate 102. The first isolation structure 112 has a protrusion 114 with a first upper surface 112a. The protrusion 114 protrudes outward from a second upper surface 112b of the first isolation structure 112. In some embodiments, the logic wall 116 is arranged over the first upper surface 112a and the memory wall 118 is arranged over the second upper surface 112b. In some embodiments, the plurality of dummy gate stacks 122 may be arranged over a second isolation structure 120 separated from the first isolation structure 112 by the substrate 102.

In some embodiments, the plurality of memory devices, 520a and 520b, may be arranged within a well region 542 within the substrate 102 (e.g., an n-well within a p-type substrate). The well region 542 may extend to a position that is between the first isolation structure 112 and the second isolation structure 120. In such embodiments, a conductive contact 130 may extend though the ILD layer 128 to a pickup region comprising a contact region 544 (e.g., an n+ region) within the well region 542. The conductive contact 130 enables a bias to be applied to the well region 542 to provide for isolation and changes in the operation of the plurality of split-gate flash memory cells, 520a and 520b. In some embodiments, an upper surface of the substrate 102 is recessed between the first isolation structure 112 and the second isolation structure 120.

FIG. 5B illustrates a top-view 546 of the integrated chip shown in cross-sectional view 500. As shown in top-view 546, the memory wall 118 is arranged over the first isolation structure 112 and continuously extends as an unbroken structure around the memory region 108 comprising the plurality of split gate flash memory cells (e.g., 520a and 520b of FIG. 5A). The logic wall 116 is arranged over the first isolation structure 112 and is separated from the memory wall 118. The logic wall 116 continuously extends around the memory wall 118 as an unbroken structure. A plurality of dummy gate stacks 122 are arranged over the second isolation structure 120 and surround the logic wall 116. The first isolation structure 112 and the second isolation structure 120 are separated by the pickup region.

Figure 6:
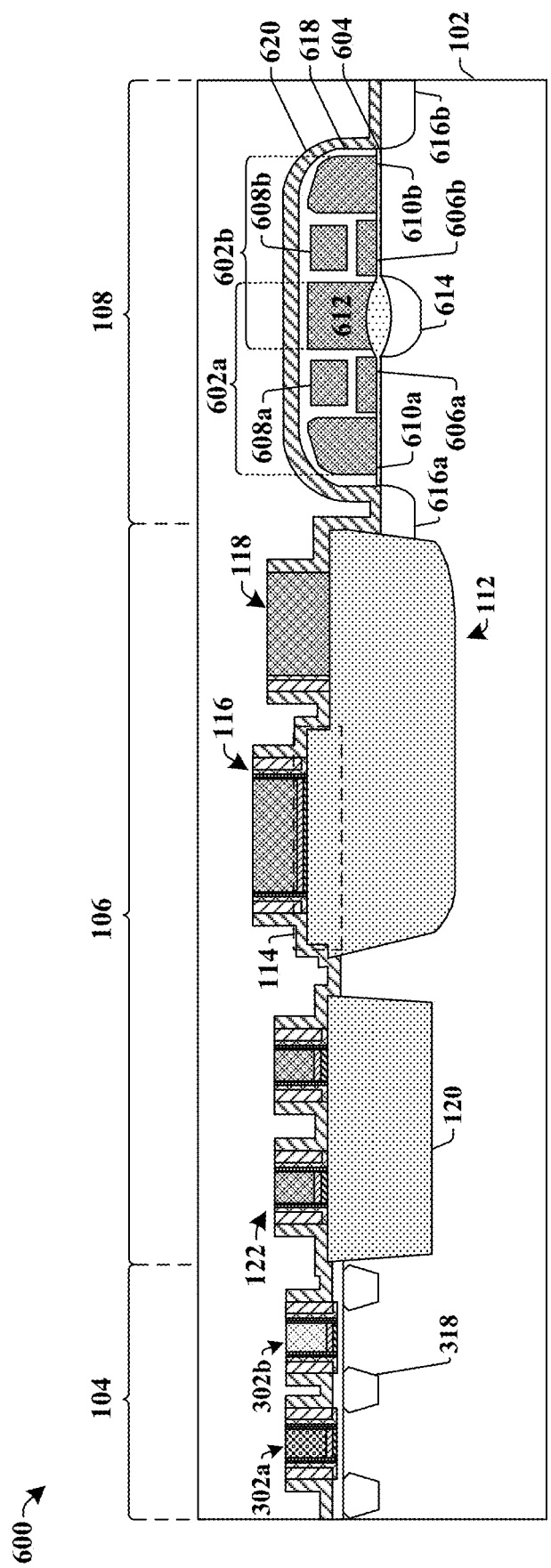
FIG. 6 illustrates a cross-sectional view of some additional embodiments of an integrated chip having an embedded memory region separated from a logic region by a boundary region.

Although FIGS. 5A-5B illustrate an embedded memory region having split gate flash memory cells, it will be appreciated that the disclosed boundary region is not limited to use with such memory cell structures. Rather, the disclosed boundary region is not limited to use with embedded memory regions having memory cells with varying structures. For example, FIG. 6 illustrates a cross-sectional view of some alternative embodiments of an integrated chip 600 having an embedded memory region separated from a logic region by a boundary region.

The integrated chip 600 comprises a substrate 102 having a logic region 104, an embedded memory region 108, and a boundary region 106. The embedded memory region 108 comprises a pair of flash memory cells, 602a and 602b, comprising a common source region 614 located between a first drain region 616a and a second drain region 616b. The common source region 614, the first drain region 616a, and the second drain region 616b are disposed along a top surface of the substrate 102. A first channel region extends between the common source region 614 and the first drain region 616a, and a second channel region extends between the common source region 614 and the second drain region 616b.

The flash memory cells, 602a and 602b, further comprise a dielectric layer 604 disposed over a substrate 102. Floating gates, 606a and 606b, are located over the dielectric layer 604. The floating gates, 606a and 606b, may comprise polysilicon, metal, metal silicide, metal nitride, or dielectric having a high trapping density, such as silicon nitride. Control gates, 608a and 608b, are disposed over the floating gates, 606a and 606b, while select gates, 610a and 610b, are disposed next to the floating gate, 606a and 606b, respectively. The control gates, 608a and 608b, and the select gates, 610a and 610b, are configured to control a data state stored in an adjacent floating gate, 606a and 606b. An erase gate 612 is arranged between the floating gates 606a and 606b, and over the common source region 614.

In some embodiments, an additional dielectric material 618 is disposed over the substrate 102 between the control gates, 608a and 608b, the select gates, 610a and 610b, the common erase gate 612, and the floating gates, 606a and 606b. In some embodiments, a protective coating 620 may be disposed over the additional dielectric material 618. The protective coating 620 may comprise a dielectric layer, such as silicon oxide, silicon nitride or a combination thereof.

FIGS. 7-15 illustrate cross-sectional views 700-1500 of some embodiments of a method of forming an integrated chip having an embedded memory region separated from a logic region by a boundary region. Although the cross-sectional views 700-1500 shown in FIGS. 7-15 are described with reference to a method, it will be appreciated that the structures shown in FIGS. 7-15 are not limited to the method but rather may stand alone separate of the method.

Figure 7:
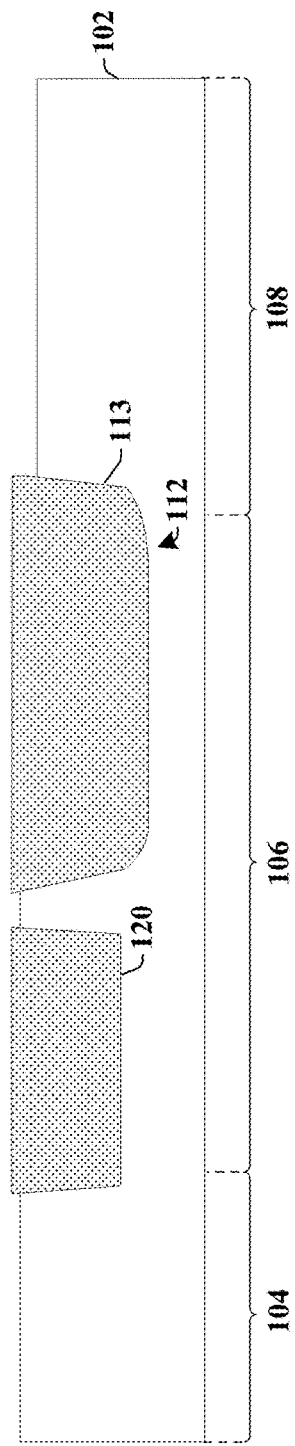

As shown in cross-sectional view 700 of FIG. 7, a substrate 102 is provided. In various embodiments, the substrate 102 may be any type of semiconductor body (e.g., silicon, SiGe, SOI, etc.), as well as any other type of semiconductor, epitaxial, dielectric, or metal layers, associated therewith. The substrate 102 comprises a logic region 104 separated from an embedded memory region 108 by way of a boundary region 106.

A base region 113 of a first isolation structure 112 and a second isolation structure 120 are formed within the boundary region 106 of the substrate 102. In some embodiments, the base region 113 of the first isolation structure 112 and the second isolation structure 120 may be formed by selectively etching the substrate 102 to form recesses defined by interior surfaces of the substrate 102. A dielectric material (e.g., an oxide, a nitride, or the like) is subsequently formed within the recesses. In some embodiments, the dielectric material may be formed by way of a deposition technique (e.g., physical vapor deposition (PVD), chemical vapor deposition (CVD), PE-CVD, atomic layer deposition (ALD), sputtering, etc.). In other embodiments, the dielectric material may be formed by way of low temperature oxidation process (e.g., an oxidation process performed at a temperature of less than or equal to approximately 500° C.). In some embodiments, the base region 113 of the first isolation structure 112 and the second isolation structure 120 protrude outward from surrounding surfaces of the substrate 102 by a non-zero distance.

Figure 8A:
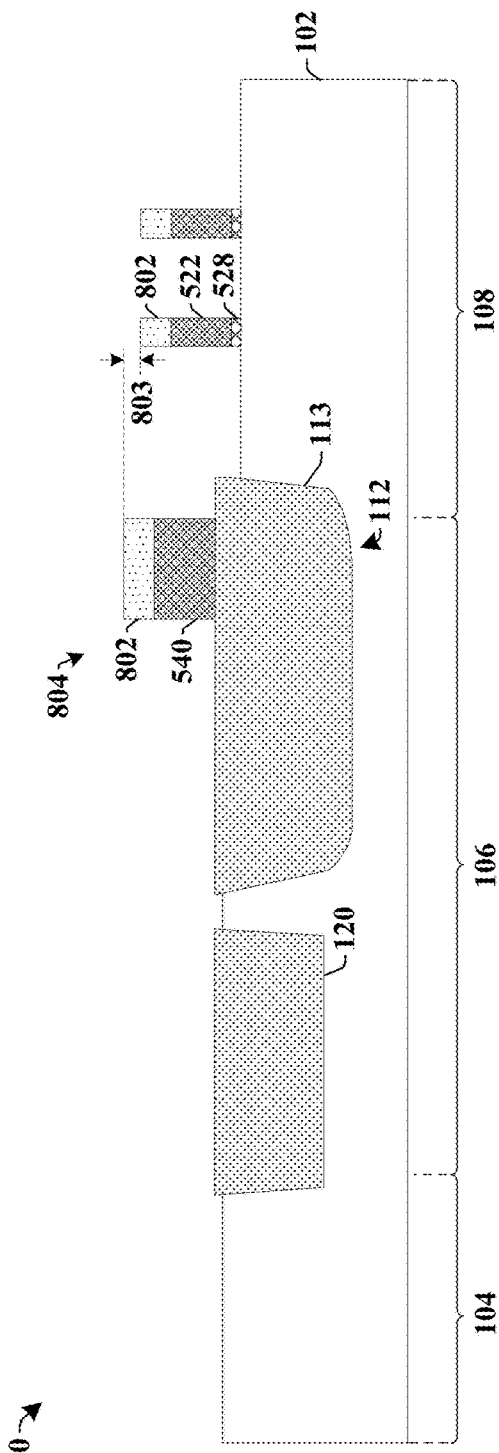

As shown in cross-sectional view 800 of FIGS. 8A-8C, a plurality of memory device structures (810a-810b of FIG. 8C) are formed within the embedded memory region 108 and a memory wall (804 of FIG. 8C) is formed over the base region 113 of the first isolation structure 112 within the boundary region 106. In some embodiments, the plurality of memory device structures (810a-810b of FIG. 8C) may correspond to non-volatile memory (NVM) devices (e.g., flash memory devices). The memory wall (804 of FIG. 8C) may be formed concurrent to the formation of the plurality of memory device structures 810a-810b of FIG. 8C).

As shown in cross-sectional view 800 of FIG. 8A, a gate dielectric layer is formed over the substrate 102. In some embodiments, the gate dielectric layer may comprise an oxide (e.g., $SiO_2$) formed by way of a thermal process. In alternative embodiments, the gate dielectric layer may be formed by a deposition process (e.g., chemical vapor deposition (CVD), physical vapor deposition (PVD), atomic layer deposition (ALD), etc.). A select gate layer is formed over the gate dielectric layer and the base region 113 of the first isolation structure 112, and a first hard mask layer 802 is selectively formed over the select gate layer. The select gate layer and the gate dielectric layer are then etched according to the first hard mask layer 802 to define select gates 522 over a gate dielectric 528 and a memory wall 804 having a memory wall core 540 over the base region 113 of the first isolation structure 112. In some embodiments, an upper surface of the first hard mask layer 802 over the memory wall core 540 is vertically offset from upper surfaces of the first hard mask layer 802 over the select gates 522 by a non-zero distance 803.

As shown in cross-sectional view 806 of FIG. 8B, a charge trapping layer is formed over the memory wall core 540 and the select gates 522, and a control gate layer is formed over the charge trapping layer within the embedded memory region 108. A second hard mask layer 808 is selectively formed over the control gate layer. The control gate layer and the charge trapping layer are then etched according to the second hard mask layer 808 to define a control gate 524 and a charge trapping layer 526 within the plurality of memory device structures 810a-810b. In some embodiments, the select gate layer and a control gate layer may comprise doped polysilicon formed by deposition processes (e.g., CVD, PVD, ALD, etc.). In some embodiments, the first hard mask layer 802 and the second hard mask layer 808 may comprise an oxide (e.g., PE-SiON), a nitride (e.g., silicon nitride (SiN), a carbide (e.g., SiC), or the like.

As shown in cross-sectional view 812 of FIG. 8C, sidewall spacers 530 are formed along sidewalls of the memory wall 804 and the memory device structures 810a-810b. In some embodiments, the sidewall spacers 530 may be formed by depositing one or more spacer layers over the substrate 102 using a deposition technique (e.g., PVD, CVD, PE-CVD, ALD, sputtering, etc.). In various embodiments, the one or more spacer layers may comprise silicon nitride, a silicon dioxide ($SiO_2$), silicon oxy-nitride (e.g., SiON), or a similar material. The one or more spacer layers are subsequently etched to remove the one or more spacer layers from horizontal surfaces, leaving sidewall spacers 530 along opposing sides of the memory wall 804 and the memory device structures 810a-810b.

Source/drain regions 532 are formed within the embedded memory region 108. In some embodiments, the source/drain regions 532 may be formed by selectively implanting a dopant species into the substrate 102. In some embodiments, the dopant species may be selectively implanted into the substrate 102 according to a mask comprising the memory device structures 810a-810b. In various embodiments, the dopant species may comprise a p-type dopant (e.g., boron, gallium, etc.) or an n-type dopant (e.g., phosphorus, arsenic, etc.). In some embodiments, after implanting the dopant species into the substrate 102, a drive-in anneal may be performed to diffuse the dopant species within the substrate 102.

As shown in cross-sectional view 900 of FIG. 9, a maximum height of the first isolation structure 112 is adjusted. In some embodiments, the maximum height may be adjusted by forming a protrusion 114 protruding outward from an upper surface of the base region 113 of the first isolation structure 112. In some embodiments, the protrusion 114 may be formed using a high-temperature oxide (HTO) process to increase a height (e.g., by between 100 angstroms and 300 angstroms) of a part of the first isolation structure 112. For example, in some embodiments, a masking layer 902 may be formed over the logic region 104 and the embedded memory region 108 and a thermal oxidation process may be subsequently formed. In other embodiments, the protrusion 114 may be formed using a deposition process followed by an etching process.

In some embodiments, the protrusion 114 may be formed to comprise a high-temperature oxide (HTO) (e.g., an oxide that is formed at a temperature of greater than or equal to approximately 600° C.). In some such embodiments, the protrusion 114 may be formed using a low pressure chemical vapor deposition (LPCVD) process. In some embodiments, the LPCVD process may performed at a pressure that is in a range of between approximately 10 mT (milli-Torr) and approximately 1000 mT. In other embodiments, the LPCVD process may performed at other pressures. In some embodiments, the LPCVD process used to form the HTO may performed at a temperature that is in a range of between approximately 800° C. and approximately 1,300° C. In some embodiments, the HTO may comprise silicon dioxide formed by reacting dichlorosilane ($SiH_2Cl_2$) and nitrous oxide ($2N_2O$) within a processing chamber (e.g., $SiH_2Cl_2 + 2N_2O \rightarrow SiO_2 + 2N_2 + 2HCl$).

As shown in cross-sectional views 1000 and 1014 of FIGS. 10A-10B, a plurality of transistor gate stacks 1008a-1008b are formed within the logic region 104. Within the boundary region 106, a plurality of dummy gate stacks 1010a-1010b are formed over the second isolation structure 120 and a logic wall 1012 is formed over the protrusion 114. In some embodiments, the plurality of transistor gate stacks 1008a-1008b, the plurality of dummy gate stacks 1010a-1010b, and the logic wall 1012 may be formed with an embedded memory cap 1002 covering the plurality of memory device structure 810a-810b and the memory wall 804. In some embodiments, the plurality of transistor gate stacks 1008a-1008b, the plurality of dummy gate stacks 1010a-1010b, and the logic wall 1012 may be concurrently formed.

As shown in cross-sectional view 1000 of FIG. 10A, one or more gate dielectric layers are formed over the substrate 102. A gate electrode layer is formed over the one or more gate dielectric layers. The one or more gate dielectric layers and the gate electrode layer are selectively patterned to define the plurality of transistor gate stacks 1008a-1008b, the plurality of dummy gate stacks 1010a-1010b, and the logic wall 1012, respectively comprising a gate electrode layer 1004 arranged over gate dielectrics 508-510. The logic wall 1012 has an upper surface that overlies upper surfaces of the memory wall 804 and the memory device structures 810a-810b. In various embodiments, the gate electrode layer 1004 within the plurality of transistor gate stacks 1008a-1008b, the plurality of dummy gate stacks 1010a-1010b, and/or the logic wall 1012 may comprise a sacrificial gate electrode layer that is subsequently removed during a metal gate replacement process (e.g., shown in FIGS. 13A-13B).

In some embodiments, prior to the etching process a hard mask layer 1006 may be selectively formed over the gate electrode layer 1004 and the one or more gate dielectric layers. The hard mask layer 1006 is subsequently used as a mask for the etching process. In some embodiments, the gate electrode layer may comprise polysilicon. In some embodiments, the one or more gate dielectric layers may comprise an oxide (e.g., silicon oxide), a nitride (e.g., silicon oxynitride), or the like. In other embodiments, the one or more gate dielectric layers may comprise a high-k dielectric material, such as hafnium oxide ($HfO_2$), $TiO_2$, $HfZrO$, $Ta_2O_3$, $HfSiO_4$, $ZrO_2$, $ZrSiO_2$, or the like.

As shown in cross-sectional view 1014 of FIG. 10B, sidewall spacers 206 are formed along opposing sides of the plurality of transistor gate stacks 1008a-1008b, the plurality of dummy gate stacks 1010a-1010b, and the logic wall 1012. In various embodiments, the sidewall spacers 206 may comprise silicon nitride, silicon dioxide, silicon oxy-nitride, or a similar material. In some embodiments, the sidewall spacers 206 may be formed by depositing one or more spacer layers 512-516 over the substrate 102. In some embodiments, the one or more spacer layers 512-516 are deposited over the substrate 102 using a deposition technique (e.g., PVD, CVD, PE-CVD, ALD, sputtering, etc.). In some embodiments, the one or more spacer layers 512-516 may comprise a first spacer layer 512 comprising an oxide, a second spacer layer 514 comprising a nitride, and a third spacer layer 516 comprising an oxide. The one or more spacer layers 512-516 are subsequently etched to remove the one or more spacer layers 512-516 from horizontal surfaces.

Source/drain regions 518 are formed within the logic region 104. In some embodiments, the source/drain regions 518 may be formed by selectively implanting a dopant species into the substrate 102 according to a mask comprising the plurality of transistor gate stacks 1008a-1008b, the plurality of dummy gate stacks 1010a-1010b, the logic wall 1012, and the sidewall spacers 206.

In some alternative embodiments (not shown), the sidewall spacers 206 and 530 may be concurrently formed after formation of the plurality of transistor gate stacks 1008a-1008b, the plurality of dummy gate stacks 1010a-1010b, and the logic wall 1012. In such embodiments, the embedded memory cap 1002 may be removed after formation of the plurality of transistor gate stacks 1008a-1008b, the plurality of dummy gate stacks 1010a-1010b, and the logic wall 1012. One or more spacer layers are subsequently formed in the logic region 104, the boundary region 106, and the embedded memory region 108. The one or more spacer layers are then etched to concurrently form sidewall spacers 206 and 530 by removing the one or more spacer layers 512-516 from horizontal surfaces.

As shown in cross-sectional view 1100 of FIG. 11, a contact etch stop layer (CESL) 126 is formed on to the substrate 102. The CESL 126 may be formed by a deposition process (e.g., CVD, PVD, PE-CVD, etc.) and comprise a nitride layer (e.g., silicon nitride), a carbide layer (e.g., silicon carbide), or the like. A first inter-level dielectric (ILD) layer 1102 is formed onto the substrate 102 at a position above the CESL 126. In some embodiments the ILD layer 1102 may comprise an oxide, a low-k dielectric material, or an ultra low-k dielectric material.

Figure 12:
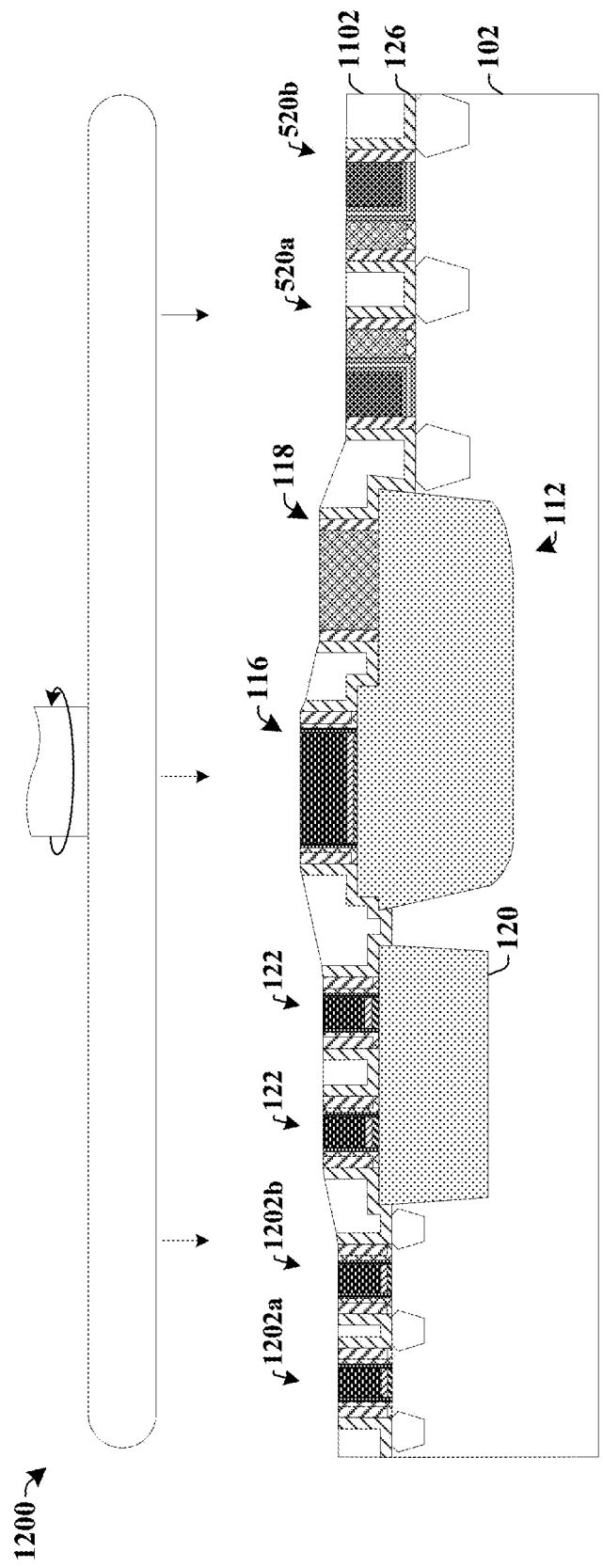

As shown in cross-sectional view 1200 of FIG. 12, a first planarization process 1201 is performed. The first planarization process 1201 removes a part of the CESL 126 and the first ILD layer 1102 to form a plurality of transistor gate stacks 1202a-1202b, a plurality of dummy gate stacks 122, and a logic wall 116. In some embodiments, the first planarization process 1201 may comprise a chemical mechanical planarization (CMP) process. The first planarization process 1201 removes parts of the CESL 126, the first ILD layer 902, and the hard mask layer (1006 of FIG. 11) down to and exposing the polysilicon gate. In some embodiments, the first planarization process 1201 may also remove the first hard mask layer (802 of FIG. 11) and the second hard mask layer (808 of FIG. 11) to define a memory wall 118 and a plurality of memory devices 520a-520b. In other embodiments, first hard mask layer (802 of FIG. 11) and the second hard mask layer (808 of FIG. 11) may be removed prior to the first planarization process.

It has been appreciated that the removal rate of a CMP process is based upon such factors as pressure, temperature, and speed of the CMP process. It has also been appreciated that the removal rate of the CMP process is different for different materials (resulting in local non-planarities over the substrate). Because the first elevation of the logic wall 116 is higher than the elevations of the plurality of memory devices 520a-520b and the memory wall 118, the logic wall 116 limits pressures that the first planarization process 1201 applies to the memory wall 118 and along edges of the embedded memory region 108. The limited pressure will reduce a removal rate of the memory wall 118 and the plurality of memory devices 520a-520b along edges of the embedded memory region 108 and therefore will mitigate dishing along the edges.

Figure 13A:
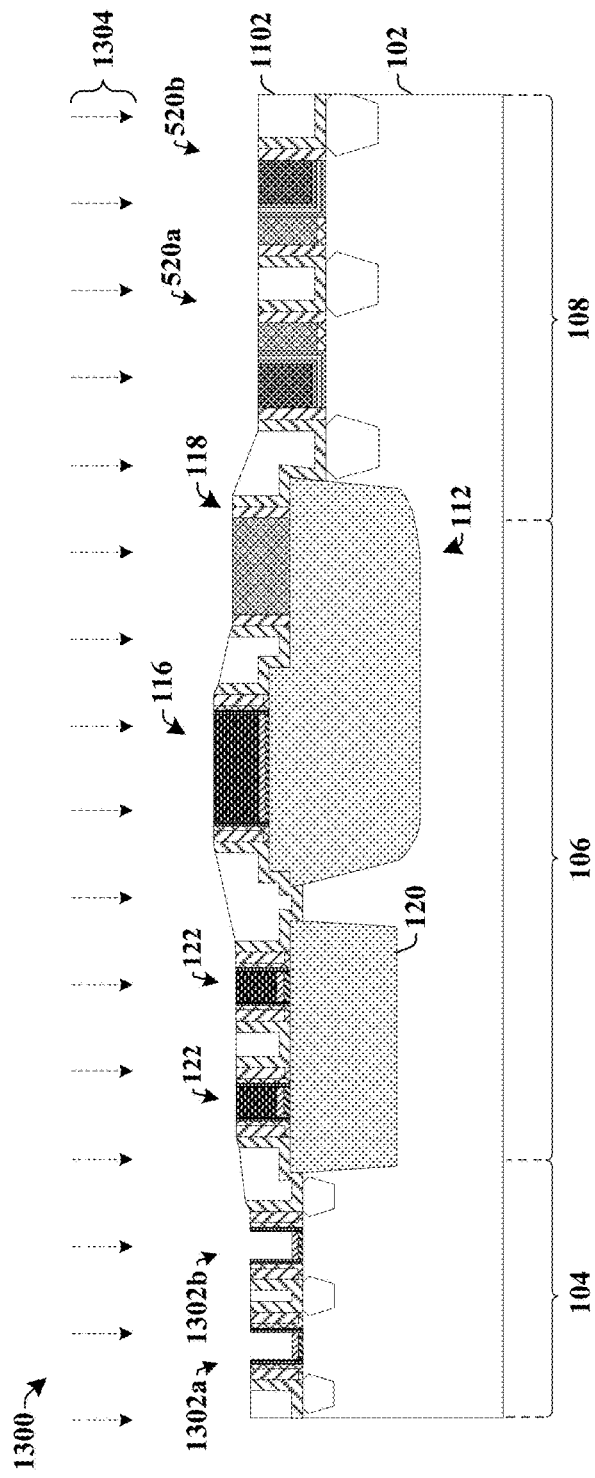
Figure 13B:
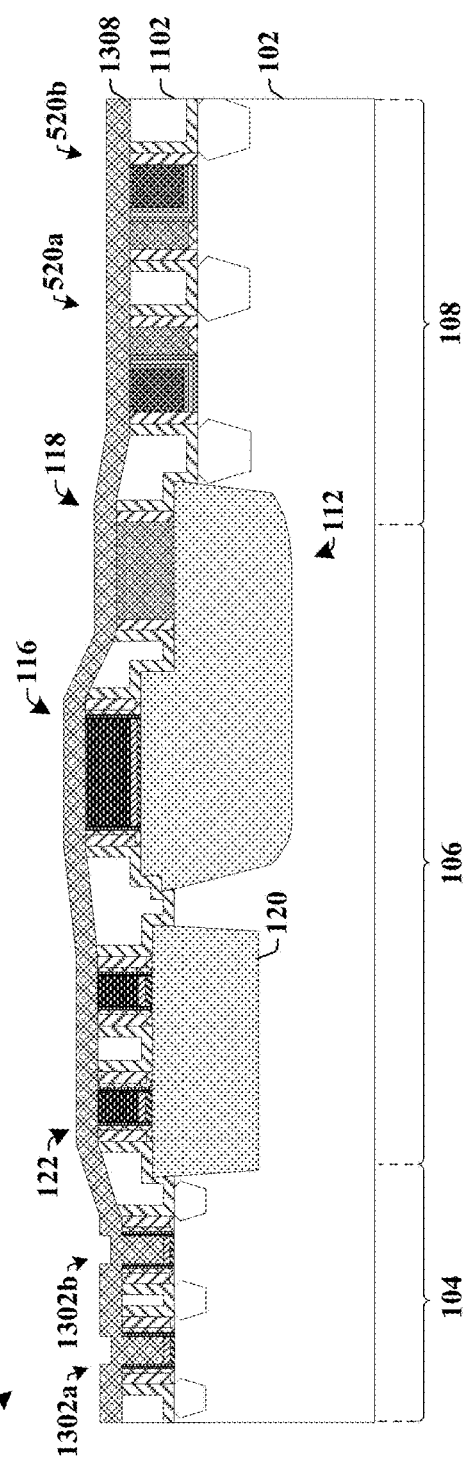

As shown in cross-sectional views, 1300 and 1306, of FIGS. 13A-13B, a replacement metal gate process is performed on transistors within the logic region.

As shown in cross-sectional view 1300 of FIG. 13A, the replacement metal gate process removes the gate electrode layer from the plurality of transistor gate stacks 1202a-1202. Removing the dummy gates electrodes results in gate cavities 1302a-1302b arranged between sidewall spacers. In some embodiments, the gate electrode layer may be removed by an etching process 1304. For example, in some embodiments (not shown) a masking layer (e.g., photoresist) may be selectively formed over the substrate 102 and a subsequent etching process 1304 may be performed to remove the gate electrode layer. In some additional embodiments (not shown), the etching process 1304 may also remove the gate electrode material from within the dummy gate stacks 122 and/or within the logic wall 116.

As shown in cross-sectional view 1306 of FIG. 13B, one or more gate metals 1308 are formed within the gate cavities 1302a-1302b and over the first ILD layer 1102. In various embodiments, the one or more gate metals may be formed by way of deposition processes (e.g., PVD, CVE, PE-CVD, etc.). In some additional embodiments (not shown), the one or more gate metals 1308 may be formed within the dummy gate stacks and/or within the logic wall. In some embodiments, the one or more gate metals 1308 may comprise an n-type metal such as may comprise aluminum, tantalum, titanium, or the like. In some embodiments, the one or more gate metals 1308 may comprise a p-type metal, such as platinum, tungsten, nickel, or the like. In some embodiments, the dielectric layer may also be removed and replaced with a high-k gate dielectric. In other embodiments, wherein the dielectric layer 508 comprises a high-k dielectric layer, the dielectric layer may not be removed.

Figure 14:
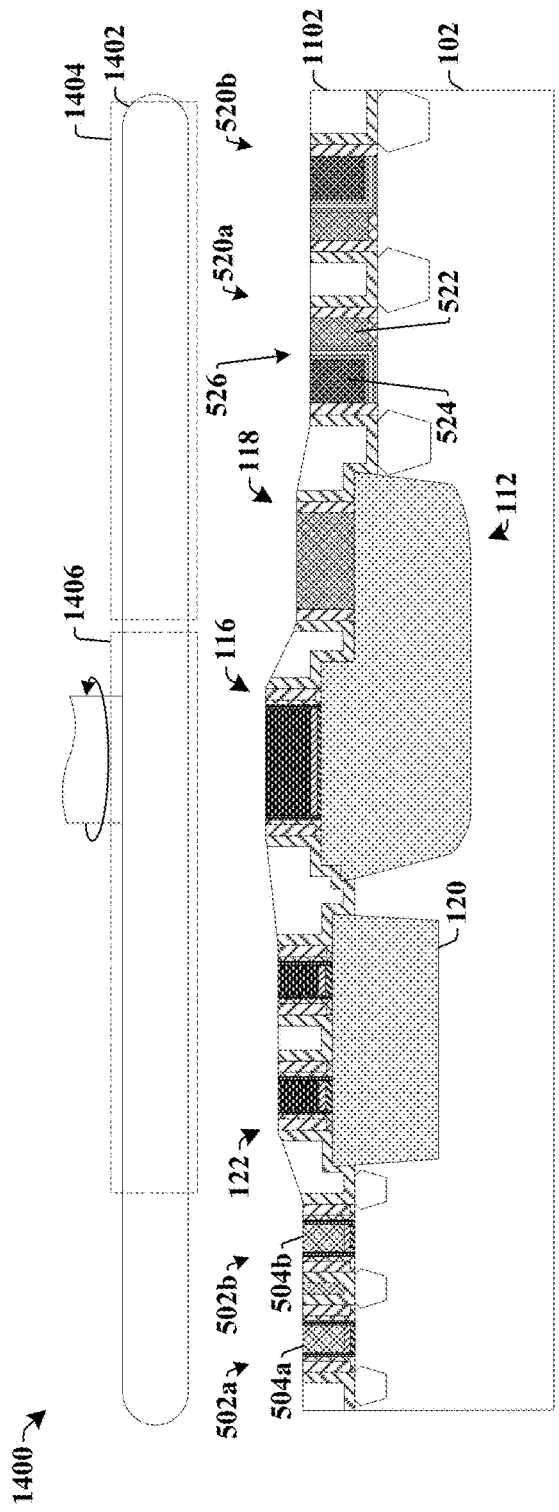

As shown in cross-sectional view 1400 of FIG. 14, a second planarization process 1401 is performed to remove excess of the one or more gate metals 1308. Removing excess of the one or more gate metals 1308 results in high-k metal gate (HKMG) transistors, 502a and 502b. The HKMG transistors, 502a and 502b, respectively comprise metal gate electrodes, 504a and 504b, separated from the substrate 102 by one or more dielectric layers 508-510. In some embodiments, the second planarization process 1401 may comprise a CMP process. Because the first elevation of the logic wall 116 is higher than the elevations of the plurality of memory devices 520a-520b and the memory wall 118, the logic wall 116 limits pressures that the second planarization process 1401 applies to the memory wall 118 and along edges of the embedded memory region 108. The limited pressure will reduce a removal rate of the memory wall 118 and the plurality of memory devices 520a-520b along edges of the embedded memory region 108 and therefore will mitigate dishing along the edges.

Figure 15:
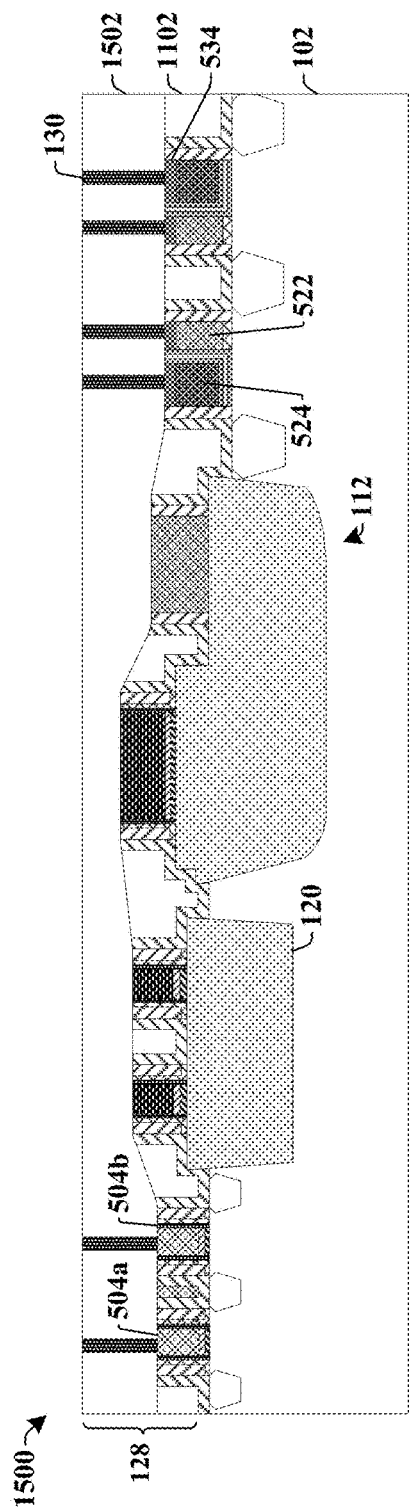

As shown in cross-sectional view 1500 of FIG. 15, a silicidation process is performed to form a silicide layer 534 along upper surfaces of the control gate 524 and the select gate 522 within the memory devices 520a-520b. In some embodiments, the silicidation process may be performed by depositing a metal layer (e.g., a nickel layer) and then performing a thermal annealing process (e.g., a rapid thermal anneal) to form a silicide layer 534.

Conductive contacts 130 are formed within a second ILD layer 1502 over the first ILD layer 1102. The conductive contacts 130 extend through the second ILD layer 1502 to contact the silicide layers 534 and the metal gate electrodes, 504a and 504b. In some embodiments, the conductive contacts 130 may be formed by way of a damascene process. In such embodiments, the second ILD layer 1502 is formed over the first ILD layer 1102. The second ILD layer 1502 is etched to form contact holes, and the contact holes are subsequently filled with a conductive material (e.g., copper and/or aluminum). A chemical mechanical planarization (CMP) process is subsequently performed to remove excess of the conductive material from over the second ILD layer 1502.

Figure 16:
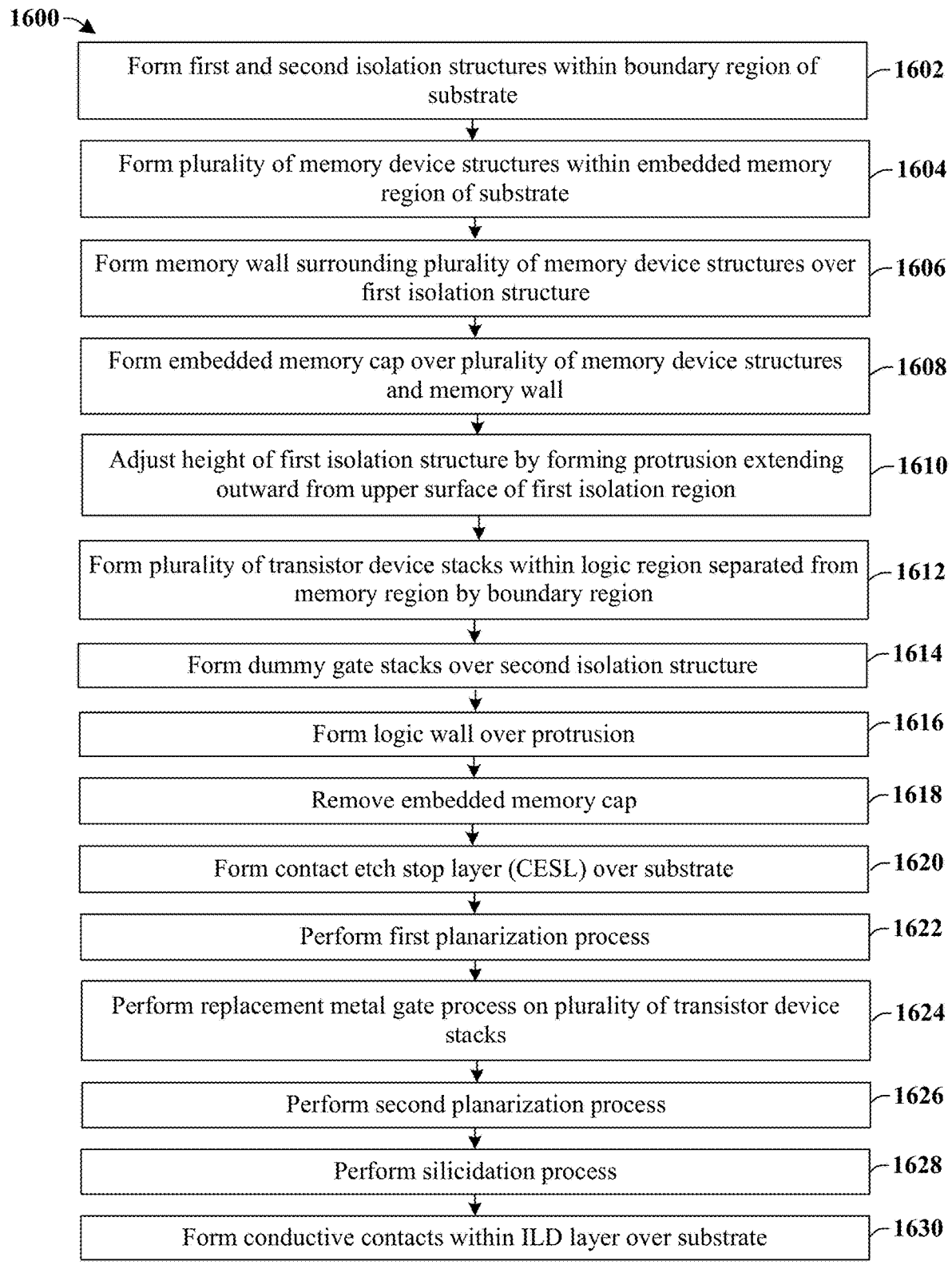
FIG. 16 illustrates a flow diagram of some embodiments of a method of forming an integrated chip having embedded memory region separated from a logic region by a boundary region.

FIG. 16 illustrates a flow diagram of some embodiments of a method 1600 of forming an integrated chip having an embedded memory region separated from a logic region by a boundary region.

While method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a base region of a first isolation structure and a second isolation structure are formed within a boundary region of a substrate. FIG. 7 illustrates a cross-sectional view 700 of some embodiments corresponding to act 1602.

At 1604, a plurality of memory device structures are formed within an embedded memory region of substrate. In some embodiments, the plurality of memory devices may comprise non-volatile memory (NVM) devices. FIGS. 8A-8C illustrate cross-sectional views of some embodiments corresponding to act 1604.

At 1606, a memory wall surrounding the plurality of memory device structures is formed over the base region 113 of the first isolation structure. FIGS. 8A-8C illustrate cross-sectional views of some embodiments corresponding to act 1606.

At 1608, an embedded memory cap is formed over the plurality of memory device structures and the memory wall. FIGS. 8A-8C illustrate cross-sectional views of some embodiments corresponding to act 1608.

At 1610, a height of a part of the first isolation structure is adjusted by forming a protrusion protruding outward from an upper surface of the first isolation structure. In some embodiments, the height may be adjusted by performing a high-temperature oxide (HTO) process to increase a height (e.g., between 100 angstroms and 200 angstroms) of a part of the first isolation structure. FIG. 9 illustrates a cross-sectional view 900 of some embodiments corresponding to act 1610.

At 1612, a plurality of transistor device stacks are formed within logic region of substrate that is separated from memory region by the boundary region. In some embodiments, the plurality of transistor device stacks may comprise sacrificial gate structures. FIGS. 10A-10B illustrate cross-sectional views of some embodiments corresponding to act 1612.

At 1614, a plurality of dummy gate stacks are formed over the second isolation structure within the boundary region. FIGS. 10A-10B illustrate cross-sectional views of some embodiments corresponding to act 1614.

At 1616, a logic wall is formed over the protrusion. FIGS. 10A-10B illustrate cross-sectional views of some embodiments corresponding to act 1616.

At 1618, the embedded memory cap is removed from over the plurality of memory device structures and the memory wall.

At 1620, a contact etch stop layer (CESL) is formed over substrate. FIG. 11 illustrates a cross-sectional view 1100 of some embodiments corresponding to act 1620.

At 1622, a first planarization process is performed to remove part of the CESL and expose the sacrificial gate structures. FIG. 12 illustrates a cross-sectional view 1200 of some embodiments corresponding to act 1622.

At 1624, a replacement metal gate process is performed on the plurality of transistor device stacks. The replacement metal gate process removes the sacrificial gate electrodes from the plurality of transistor device stacks and forms ones or more gate metals within locations of the removed sacrificial gate electrodes. FIGS. 13A-13B illustrates cross-sectional views of some embodiments corresponding to act 1624.

At 1626, a second planarization process is performed to remove excess of the ones or more gate metals. FIG. 14 illustrates a cross-sectional view 1400 of some embodiments corresponding to act 1626.

At 1628, a silicidation process is performed. FIG. 15 illustrates a cross-sectional view 1500 of some embodiments corresponding to act 1628.

At 1630, conductive contacts are formed within an ILD layer over the substrate. FIG. 15 illustrates a cross-sectional view 1500 of some embodiments corresponding to act 1630.

Accordingly, in some embodiments, the present disclosure relates to an integrated chip having an embedded memory region separated from a logic region by a boundary region that is configured reduce erosion and/or dishing along edges of an embedded memory array, an associated method of fabrication.

In some embodiments, the present disclosure relates to an integrated chip. The integrated chip includes a logic region having a plurality of transistor devices disposed within a substrate; an embedded memory region having a plurality of memory devices disposed within the substrate; a boundary region separating the logic region from the embedded memory region, the boundary region includes a first isolation structure having a first upper surface and a second upper surface below the first upper surface, the first upper surface is coupled to the second upper surface by way of a sidewall overlying the first isolation structure; a memory wall arranged on the second upper surface and surrounding the embedded memory region; and a logic wall arranged on the first upper surface and surrounding the memory wall, the logic wall having an upper surface that is above the plurality of memory devices and the memory wall. In some embodiments, the plurality of memory devices include flash memory devices having a control gate separated from a select gate by a charge trapping dielectric layer; and the memory wall includes a same material as the control gate or the select gate. In some embodiments, the interior sidewall is oriented at a non-zero angle with respect to a line normal to the second upper surface. In some embodiments, the first upper surface is disposed along a horizontal plane that overlies the second upper surface. In some embodiments, the integrated chip further includes a second isolation structure having a second dielectric material disposed within the substrate in the boundary region between the first isolation structure and the logic region; and a plurality of dummy gate stacks arranged over the second isolation structure. In some embodiments, the plurality of dummy gate stacks have upper surfaces that are below the upper surface of the logic wall. In some embodiments, an uppermost surface of the second isolation structure is arranged below the first upper surface of the first isolation structure. In some embodiments, the first isolation structure and the second isolation structure protrude outward from a surface of the substrate located between the first isolation structure and the second isolation structure. In some embodiments, the logic wall and the plurality of dummy gate stacks comprise polysilicon. In some embodiments, the logic wall comprises polysilicon and the plurality of dummy gate stacks comprise one or more gate metals. In some embodiments, the integrated chip further includes a contact etch stop layer arranged over the substrate; and an inter-level dielectric (ILD) layer laterally separated from the memory wall and the logic wall by the contact etch stop layer.

In other embodiments, the present disclosure relates to an integrated chip. The integrated chip includes a plurality of transistor devices disposed within a logic region of a substrate; a plurality of memory devices disposed within an embedded memory region of the substrate; a first isolation structure having a first dielectric material disposed within the substrate between the plurality of transistor devices and the plurality of memory devices; a second isolation structure having a second dielectric material disposed within the substrate between the first isolation structure and the plurality of transistor devices; a plurality of dummy gate stacks arranged over the second isolation structure; a memory wall continuously arranged over a lower surface of the first isolation structure and extending as a first unbroken structure around the plurality of memory devices; and a logic wall arranged over a higher surface of the first isolation structure and continuously extending as a second unbroken structure around the memory wall, the logic wall having an uppermost surface arranged along a horizontal plane that is separated from the memory wall and the plurality of dummy gate stacks by non-zero distances. In some embodiments, the first isolation structure has a base region and a protrusion that extends outward from an upper surface of the base region and that is completely confined above the base region, the memory wall contacts the base region and the logic wall contacts the protrusion. In some embodiments, the base region includes a first material and the protrusion includes a second material that is different than the first material. In some embodiments, the protrusion has a height and a width that is in a range of between approximately 20 and approximately 250 times larger than the height. In some embodiments, the protrusion has an outermost sidewall that is laterally offset from an outermost sidewall of the base region by a non-zero distance. In some embodiments, the base region has one or more surfaces defining a divot recessed below the upper surface of the base region, and the protrusion includes one or more dielectric materials that extend to within the divot. In some embodiments, the uppermost surface extends past opposing sidewalls of the logic wall.

In yet other embodiments, the present disclosure relates to a method of forming an integrated chip. The method includes forming a plurality of transistor devices within a logic region of a substrate; forming a plurality of memory devices within an embedded memory region of the substrate; forming a first dielectric within a recess in the substrate to form a base region of a first isolation structure within a boundary region of the substrate disposed between the logic region and the embedded memory region, the first isolation structure has an upper surface facing away from the substrate; subsequently increasing a height of a part of the first isolation structure by forming a protrusion extending outward from the upper surface, the protrusion includes a second dielectric confined directly above the first dielectric; and forming a logic wall over the protrusion, the logic wall surrounds the embedded memory region and has a height greater than heights of the plurality of memory devices. In some embodiments, the logic wall is formed concurrently with the plurality of transistor devices.

In yet other embodiments, the present disclosure relates to an integrated chip. The integrated chip includes a logic region having a plurality of transistor devices within a substrate; an embedded memory region having a plurality of non-volatile memory (NVM) devices within the substrate; and a boundary region separating the embedded memory region from the logic region, the boundary region includes a logic wall arranged over the substrate and continuously extending as a first unbroken structure around the embedded memory region, and the logic wall has a first height that is greater than heights of the plurality of NVM devices. In some embodiments, the integrated chip further includes a memory wall arranged between the logic wall and the plurality of NVM devices, and continuously extending as a second unbroken structure around the embedded memory region. In some embodiments, the integrated chip further includes a first isolation structure having a first dielectric material disposed within the substrate in the boundary region, the logic wall is arranged over a first upper surface of the isolation structure and the memory wall is arranged over a second upper surface of the isolation structure. In some embodiments, the logic wall includes a logic wall core comprising a conductive material; and a dielectric structure separating the logic wall core from the first isolation structure. In some embodiments, the integrated chip further includes a second isolation structure having a second dielectric material disposed within the substrate in the boundary region between the first isolation structure and the logic region; and a plurality of dummy gate stacks arranged over the second isolation structure. In some embodiments, the plurality of dummy gate stacks have a second height that is less than the first height of the logic wall.

In yet other embodiments, the present disclosure relates to a method of forming an integrated chip. The method includes forming a plurality of memory device structures over a substrate; forming a first isolation structure within a recess in the substrate; increasing a height of a part of the first isolation structure; forming a plurality of transistor gate stacks over the substrate, the first isolation structure is between the plurality of transistor gate stacks and the plurality of memory device structures; and forming a logic wall over the first isolation structure concurrent with formation of the plurality of transistor gate stacks, the logic wall surrounds the plurality of memory device structures. In some embodiments, the transistor gate stacks include a metal gate electrode including one or more gate metals; and the logic wall includes polysilicon.

In yet other embodiments, the present disclosure relates to a method of forming an integrated chip. The method includes forming a first isolation structure within a recess in a substrate; forming a plurality of memory device structures within the substrate; increasing a height of a part of the first isolation structure to provide the first isolation structure with a first upper surface and a second upper surface that is below the first upper surface; forming a plurality of transistor gate stacks separated from the plurality of memory device structures by the first isolation structure, the plurality of transistor gate stacks include a sacrificial gate electrode layer; forming a logic wall over the first upper surface concurrent with formation of the plurality of transistor gate stacks, the logic wall surrounds the plurality of memory device structures; and performing a replacement metal gate process to replace the sacrificial gate electrode layer within the plurality of transistor gate stacks (808a-808b) with one or more gate metals. In some embodiments, the method further includes forming a memory wall over the second upper surface, the memory wall surrounds the plurality of memory devices and is surrounded by the logic wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a logic region comprising a plurality of transistor devices disposed within a substrate;
an embedded memory region comprising a plurality of memory devices disposed within the substrate;
a boundary region separating the logic region from the embedded memory region, wherein the boundary region comprises:
a first isolation structure having a first upper surface and a second upper surface below the first upper surface, wherein the first upper surface is coupled to the second upper surface by way of an interior sidewall overlying the first isolation structure;
a memory wall arranged on the second upper surface and surrounding the embedded memory region; and
a logic wall arranged on the first upper surface and surrounding the memory wall, wherein the logic wall has an upper surface that is above the plurality of memory devices and the memory wall.

2. The integrated chip of claim 1,
wherein the plurality of memory devices comprise flash memory devices having a control gate separated from a select gate by a charge trapping dielectric layer; and
wherein the memory wall comprises a same material as the control gate or the select gate.

3. The integrated chip of claim 1, wherein the first upper surface is disposed along a horizontal plane that overlies the second upper surface.

4. The integrated chip of claim 1, further comprising:
a second isolation structure comprising a second dielectric material disposed within the substrate in the boundary region between the first isolation structure and the logic region; and
a plurality of dummy gate stacks arranged over the second isolation structure.

5. The integrated chip of claim 4, wherein the plurality of dummy gate stacks have upper surfaces that are below the upper surface of the logic wall.

6. The integrated chip of claim 4, wherein an uppermost surface of the second isolation structure is arranged below the first upper surface of the first isolation structure.

7. The integrated chip of claim 4, wherein the first isolation structure and the second isolation structure protrude outward from a surface of the substrate located between the first isolation structure and the second isolation structure.

8. The integrated chip of claim 4, wherein the logic wall and the plurality of dummy gate stacks comprise polysilicon.

9. The integrated chip of claim 4, wherein the logic wall comprises polysilicon and the plurality of dummy gate stacks comprise one or more gate metals.

10. The integrated chip of claim 1, further comprising:
a contact etch stop layer arranged over the substrate; and
an inter-level dielectric (ILD) layer laterally separated from the memory wall and the logic wall by the contact etch stop layer.

11. An integrated chip, comprising:
a plurality of transistor devices disposed within a logic region of a substrate;
a plurality of memory devices disposed within an embedded memory region of the substrate;
a first isolation structure comprising a first dielectric material disposed within the substrate between the plurality of transistor devices and the plurality of memory devices;
a second isolation structure comprising a second dielectric material disposed within the substrate between the first isolation structure and the plurality of transistor devices;
a plurality of dummy gate stacks arranged over the second isolation structure;
a memory wall continuously arranged over a lower surface of the first isolation structure and extending as a first unbroken structure around the plurality of memory devices; and
a logic wall arranged over a higher surface of the first isolation structure and continuously extending as a second unbroken structure around the memory wall, wherein the logic wall has an uppermost surface arranged along a horizontal plane that is separated from the memory wall and the plurality of dummy gate stacks by non-zero distances.

12. The integrated chip of claim 11,
wherein the first isolation structure comprises a base region and a protrusion that extends outward from an upper surface of the base region and that is completely confined above the base region; and
wherein the memory wall contacts the base region and the logic wall contacts the protrusion.

13. The integrated chip of claim 12, wherein the base region comprises a first material and the protrusion comprises a second material that is different than the first material.

14. The integrated chip of claim 12, wherein the protrusion has a height and a width that is in a range of between approximately 20 and approximately 250 times larger than the height.

15. The integrated chip of claim 12, wherein the protrusion has an outermost sidewall that is laterally offset from an outermost sidewall of the base region by a non-zero distance.

16. The integrated chip of claim 11, wherein the uppermost surface extends past opposing sidewalls of the logic wall.

17. An integrated chip, comprising:
a plurality of transistor devices within a logic region of a substrate;
a plurality of memory devices within an embedded memory region of the substrate;
a first dielectric disposed within a first recess in the substrate, the first recess defined by sidewalls of the substrate that are laterally between the logic region and the embedded memory region;
a second dielectric disposed over an upper surface of the first dielectric and completely confined directly above the first dielectric;
a logic wall disposed directly over the second dielectric and comprising a gate electrode material disposed between sidewall spacers; and
wherein a horizontal plane that is parallel to the upper surface of the first dielectric extends along a top of the logic wall, the horizontal plane vertically separated from tops of the memory devices by one or more non-zero distances.

18. The integrated chip of claim 17, wherein the first dielectric extends past outermost sidewalls of the second dielectric in opposing directions.

19. The integrated chip of claim 17, further comprising:
a third dielectric disposed within a second recess within the substrate, the second recess defined by sidewalls of the substrate that are laterally between the first recess and the logic region; and
a plurality of dummy gate stacks arranged directly over the third dielectric.

20. The integrated chip of claim 19, wherein the logic wall and the plurality of dummy gate stacks both comprise one or more same materials.

* * * * *